(12) United States Patent
Fujii et al.

(10) Patent No.: US 8,148,711 B2
(45) Date of Patent: Apr. 3, 2012

(54) NONVOLATILE MEMORY ELEMENT, MANUFACTURING METHOD THEREOF, AND NONVOLATILE SEMICONDUCTOR APPARATUS USING NONVOLATILE MEMORY ELEMENT

(75) Inventors: Satoru Fujii, Osaka (JP); Yoshihiko Kanzawa, Osaka (JP); Takeshi Takagi, Kyoto (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 12/600,793

(22) PCT Filed: May 16, 2008

(86) PCT No.: PCT/JP2008/001230
§ 371 (c)(1),
(2), (4) Date: Nov. 18, 2009

(87) PCT Pub. No.: WO2008/146461
PCT Pub. Date: Dec. 4, 2008

(65) Prior Publication Data
US 2010/0148143 A1 Jun. 17, 2010

(30) Foreign Application Priority Data

May 18, 2007 (JP) ................. 2007-132893

(51) Int. Cl.
*H01L 45/00* (2006.01)
(52) U.S. Cl. ............... 257/5; 257/2; 257/324; 257/314; 257/E21.078; 257/E45.001
(58) Field of Classification Search ............... 257/2, 5, 257/324, 314, E21.078, E45.001
See application file for complete search history.

(56) References Cited

U.S. PATENT DOCUMENTS

| 5,994,757 A | 11/1999 | Ichikawa et al. |
| 2005/0110983 A1 | 5/2005 | Jeong et al. |

FOREIGN PATENT DOCUMENTS

| JP | 63-050081 | 3/1988 |
| JP | 07-263647 | 10/1995 |
| JP | 9-166792 | 6/1997 |
| JP | 2004-349689 | 12/2004 |
| JP | 2004-363604 | 12/2004 |
| JP | 2005-159325 | 6/2005 |
| JP | 2005-302876 | 10/2005 |
| JP | 2006-032898 | 2/2006 |

(Continued)

OTHER PUBLICATIONS

Baek, I.G., et al., "Highly Scalable Non-volatile Resistive Memory using Simple Binary Oxide Driven by Asymmetric Unipolar Voltage Pulses", Tech Digest IEDM, 2004, IEEE.

(Continued)

*Primary Examiner* — Long Pham
(74) *Attorney, Agent, or Firm* — McDermott Will & Emery LLP

(57) ABSTRACT

A nonvolatile semiconductor apparatus of the present invention comprises (103), a second electrode (105), and a resistance variable layer (104) disposed between the first electrode (103) and the second electrode (105), a resistance value of the resistance variable layer being switchable reversibly in response to an electric signal applied between the electrodes (103), (105), wherein the resistance variable layer (104) comprises an oxide containing tantalum and nitrogen.

15 Claims, 17 Drawing Sheets

FOREIGN PATENT DOCUMENTS

| | | |
|---|---|---|
| JP | 2006-040946 | 2/2006 |
| JP | 2007-027537 | 2/2007 |
| JP | 2008-108807 | 5/2008 |
| JP | 2008108807 * | 5/2008 |
| WO | WO 96/02867 A1 | 2/1996 |
| WO | WO 2007/046144 A1 | 4/2007 |

OTHER PUBLICATIONS

Fujimoto, M., et al., "High-Speed Resistive Switching of $TiO_2$/TiN Nano-Crystalline Thin Film", Japanese Journal of Applied Physics, 2006, pp. L310-L312, vol. 45 No. 11.

Japanese Office Action issued in Japanese Patent Application No. 2008-545107, mailed Dec. 24, 2008.

* cited by examiner

U.S. 8,148,711 B2

NONVOLATILE MEMORY ELEMENT, MANUFACTURING METHOD THEREOF, AND NONVOLATILE SEMICONDUCTOR APPARATUS USING NONVOLATILE MEMORY ELEMENT

RELATED APPLICATIONS

This application is the U.S. National Phase under 35 U.S.C. §371 of International Application No. PCT/JP2008/001230, filed on May 16, 2008, which in turn claims the benefit of Japanese Application No. 2007-132893, filed on May 18, 2007, the disclosures of which Applications are incorporated by reference herein.

TECHNICAL FIELD

The present invention relates to a nonvolatile memory element. More particularly, the present invention relates to a resistance variable nonvolatile memory element whose resistance value switches in response to an electric signal applied, and a manufacturing method thereof, and a nonvolatile semiconductor apparatus using the nonvolatile memory element.

BACKGROUND ART

With recent advancement of digital technologies, higher functionality of electronic hardware such as portable information devices and home information appliances have been brought about. For this reason, demands for an increase in a capacity of a nonvolatile memory element, reduction in a write electric power in the memory element, reduction in write/read time in the memory element, and longer life of the memory element have been increasing.

In response to such demands, it is said that there is a limitation on miniaturization of a flash memory using the existing floating gate. On the other hand, a nonvolatile memory element (resistance variable memory) using a resistance variable layer as a material of a memory portion is formed by a memory element having a simple structure including a resistance variable element. Therefore, further miniaturization, a higher-speed, and lower electric power consumption of the nonvolatile memory element are expected.

When using the resistance variable layer as the material of the memory portion, its resistance value switches from a high-resistance value to a low-resistance value or from the low-resistance value to the high-resistance value, for example, by applying electric pulses. In this case, it is necessary to clearly distinguish two values, i.e., the high-resistance value and the low-resistance value, to switch the resistance value stably between the low-resistance value and the high-resistance value at a high-speed, and to retain these two values in a nonvolatile manner. For the purpose of stabilization of such memory characteristics and miniaturization of memory elements, a variety of proposals have been proposed in the past.

As one of such proposals, patent document 1 discloses a memory element in which memory cells are formed by resistance variable elements each of which includes two electrodes and a storing layer sandwiched between these electrodes and is configured to reversibly switch a resistance value of the storing layer. FIG. 17 is a cross-sectional view showing a configuration of such a conventional memory element.

As shown in FIG. 17, the memory element has a configuration in which plural resistance variable elements 10 forming memory cells are arranged in an array form. The resistance variable element 10 has a configuration in which a high-resistance film 2 and an ion source layer 3 are sandwiched between a lower electrode 1 and an upper electrode 4. The high-resistance film 2 and the ion source layer 3 form a storing layer. The storing layer enables data to be stored in the resistance variable element 10 in each memory cell.

The resistance variable elements 10 are respectively disposed above MOS transistors 18 formed on a semiconductor substrate 11. The MOS transistor 18 includes source/drain regions 13 formed in a region isolated by an element isolating layer 12 inside the semiconductor substrate 11 and a gate electrode 14. The gate electrode 14 also serves as a word line which is one address wire of the memory element.

One of the source/drain regions 13 of the MOS transistor 18 is electrically connected to the lower electrode 1 of the resistance variable element 10 via a plug layer 15, a metal wire layer 16, and a plug layer 17. The other of the source/drain regions 13 of the MOS transistor 18 is connected to the metal wire layer 16 via the plug layer 15. The metal wire layer 16 is connected to a bit line which is the other address wire of the memory element.

By applying electric potentials of different polarities between the lower electrode 1 and the upper electrode 4 of the resistance variable element 10 configured as described above, ion source of the ion source layer 3 forming the storing layer is caused to migrate to the high-resistance layer 2. Or, the ion source is caused to migrate from the high-resistance layer 2 to the upper electrode 4. Thereby, the resistance value of the resistance variable element 10 switches from a high-resistance state value to a low-resistance state value, or from the low-resistance state value to the high-resistance state value, so that data is stored.

A memory element (phase-change memory) is also known, in which a resistance variable material sandwiched between an upper electrode and a lower electrode forms a first electric pulse varying resistance layer having a polycrystalline structure and a second electric pulse varying resistance layer having a nano crystal or an amorphous structure. The resistance layer formed of the resistance variable material is controlled by switching its resistance value according to a voltage and a pulse width of electric pulses applied, thereby operating as a resistance variable element (see for example, Patent document 2).

Examples using transition metal oxide consisting of two elements, which are different from the resistance variable materials disclosed in Patent documents 1 and 2, are reported. For example, Patent document 3 discloses as the resistance variable material, NiO, $V_2O_5$, ZnO, $Nb_2O_5$, $TiO_2$, $WO_3$, or CoO. These materials consist of two elements and therefore, composition control therefor and film forming using them are relatively easy. In addition, these materials may be relatively highly compatible with a semiconductor manufacturing process.

Patent document 4 discloses a variety of resistance variable materials obtained by rapid metal-insulator transfer of a p-type oxide semiconductor material comprising metal elements. In particular, Ga, As, $VO_2$, etc, are disclosed as specific examples. Furthermore, Patent document 5 discloses examples of a resistance variable material, which are titanium oxide and $Ta_2O_5$ as tantalum oxide as insulators whose resistance states switch, respectively.

Patent document 1: Japanese Laid-Open Patent Application Publication No. 2006-40946
Patent document 2: Japanese Laid-Open Patent Application Publication No. 2004-349689

Patent document 3: Japanese Laid-Open Patent Application Publication No. 2004-363604
Patent document 4: Japanese Laid-Open Patent Application Publication No. 2006-32898
Patent document 5: Japanese Laid-Open Patent Application Publication No. Hei. 7-263647
Non-patent document 1: I. G. Beak Et Al., Tech. Digest IEDM 204, 587 page
Non-patent document 2: Japanese Journal of Applied Physics Vol 45, No 11, 2006, pp. L310-L312 FIG. 2

DISCLOSURE OF THE INVENTION

Problems to be Solved by the Invention

However, the transition metal oxides used as the above described conventional resistance variable materials have the following problems.

When using the transition metal oxide such as NiO, a long pulse of μs order is required to switch the resistance variable material from the low-resistance state to the high-resistance state. Therefore, a problem that a higher-speed is difficult to achieve arises.

When using $TiO_2$ as the transition metal oxide, TiN is required to be oxidized in oxygen atmosphere at 400 degrees centigrade to form a $TiO_2$/TiN film structure. Therefore, a problem that a relatively high process temperature must be used arises.

When using $Ta_2O_5$ as the transition metal oxide, it serves as an antifuse which is usable only in one operation from the high-resistance state to the low-resistance state. Therefore, a problem that rewriting cannot be performed arises. In addition, in the case of $Ta_2O_5$ thin film, oxygen-vacancy substitutional Ta atoms are locally present within the thin film. It is difficult to completely remove these substitutional Ta atoms. As a result, a leak current may be generated in a region where the substitutional Ta atoms are present. Furthermore, in a semiconductor process, the $Ta_2O_5$ may be reduced in $H_2$ treatment step.

The present invention is made in view of the circumstances, and an object of the present invention is to provide a nonvolatile memory element which is capable of high-speed operation and has a reversibly stable rewrite characteristic and a good retention characteristic of a resistance value, a manufacturing method of the nonvolatile memory element which is highly compatible with a semiconductor manufacturing process, and a nonvolatile semiconductor apparatus using the nonvolatile memory element.

Means for Solving the Problem

To achieve the above described objective, a nonvolatile memory element of the present invention comprises a first electrode; a second electrode; and a resistance variable layer disposed between the first electrode and the second electrode, a resistance value of the resistance variable layer being switchable reversibly in response to an electric signal applied between the first electrode and the second electrode; wherein the resistance variable layer comprises an oxide containing tantalum and nitrogen.

A method of manufacturing a nonvolatile memory element of the present invention including a first electrode; a second electrode; and a resistance variable layer disposed between the first electrode and the second electrode, a resistance value of the resistance variable layer being switchable reversibly in response to an electric signal applied between the first electrode and the second electrode; wherein the resistance variable layer includes an oxide containing tantalum and nitrogen (a tantalum oxynitride), and the tantalum oxynitride is formed by a sputtering process.

A nonvolatile semiconductor apparatus of the present invention comprises a semiconductor substrate; and a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires, and plural nonvolatile memory elements which are provided to respectively correspond to the three-dimensional cross points between the plural first electrode wires and the plural second electrode wires; wherein each of the nonvolatile memory elements includes a resistance variable layer disposed between the first electrode wire and the second electrode wire, resistance values of the resistance variable layer being switchable reversibly in response to electric signals applied between the first electrode wire and the second electrode wire; and wherein the resistance variable layer includes an oxide containing tantalum and nitrogen.

A nonvolatile semiconductor apparatus of the present invention comprises a semiconductor substrate; and a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires, and nonvolatile memory elements which are provided to respectively correspond to three-dimensional cross points between the plural first electrode wires and the plural second electrode wires; wherein each of the nonvolatile memory elements includes a first electrode connected to the first electrode wire; a second electrode connected to the second electrode wire; and a resistance variable layer disposed between the first electrode and the second electrode, resistance values of the resistance variable layer being switchable reversibly in response to electric signals applied between the first electrode and the second electrode; wherein the resistance variable layer comprises an oxide containing tantalum and nitrogen.

It is preferred that in the nonvolatile semiconductor apparatus according to the above invention, each of the nonvolatile memory elements includes a current suppressing element between the first electrode and the second electrode and the current suppressing element is electrically connected to the resistance variable layer.

The nonvolatile semiconductor apparatus of the present invention may comprise a multi-layer memory array in which plural layers of the memory array included in the nonvolatile semiconductor apparatus of the present invention are stacked.

A nonvolatile semiconductor apparatus of the present invention comprises: a semiconductor substrate; plural word lines and plural bit lines which are provided on the semiconductor substrate such that the plural word lines and the plural bit lines are arranged so as to cross each other; plural transistors provided to respectively correspond to cross points between the plural word lines and the plural bit lines; and plural nonvolatile memory elements provided to respectively correspond to the plural transistors such that one nonvolatile memory element corresponds to one transistor; wherein each of the nonvolatile memory elements includes a first electrode, a second electrode, and a resistance variable layer disposed between the first electrode and the second electrode, resistance values of the resistance variable layer being switchable reversibly in response to electric signals applied between the first and second electrodes via an associated transistor;

wherein the resistance variable layer comprises an oxide containing tantalum and nitrogen.

A nonvolatile semiconductor apparatus of the present invention comprises a semiconductor substrate; a logic circuit provided on the semiconductor substrate, for executing predetermined calculation; and a nonvolatile memory element provided on the semiconductor substrate and having a programming function; wherein the nonvolatile memory element includes a first electrode, a second electrode, and a resistance variable layer disposed between the first electrode and the second electrode, resistance values of the resistance variable layer being switchable reversibly in response to voltages between the electrodes; and wherein the resistance variable layer comprises an oxide containing tantalum and nitrogen.

A nonvolatile semiconductor apparatus of the present invention may be configured to comprise the nonvolatile semiconductor apparatus configured above and the nonvolatile semiconductor apparatus according to the above invention.

The above and further objects, features and advantages of the present invention will more fully be apparent from the following detailed description of preferred embodiments with accompanying drawings.

EFFECTS OF THE INVENTION

In accordance with the present invention, a nonvolatile memory element which is capable of a high-speed operation and has a reversibly stable rewrite characteristic and a good retention characteristic of resistance values, a manufacturing method of the nonvolatile memory element which is highly compatible with a semiconductor manufacturing process, and a nonvolatile semiconductor apparatus using the nonvolatile memory element, are provided.

BRIEF DESCRIPTION OF THE DRAWINGS

FIG. 19(*b*) is a graph showing the relationship between the resistance value of the resistance variable layer included in the nonvolatile memory element according to Embodiment 1 of the present invention and the number of pulse applications.

FIG. 19(*c*) is a graph showing the relationship between the resistance value of the resistance variable layer included in the nonvolatile memory element according to Embodiment 1 of the present invention and the number of pulse applications.

EXPLANATION OF REFERENCE NUMERALS

Figure 1:
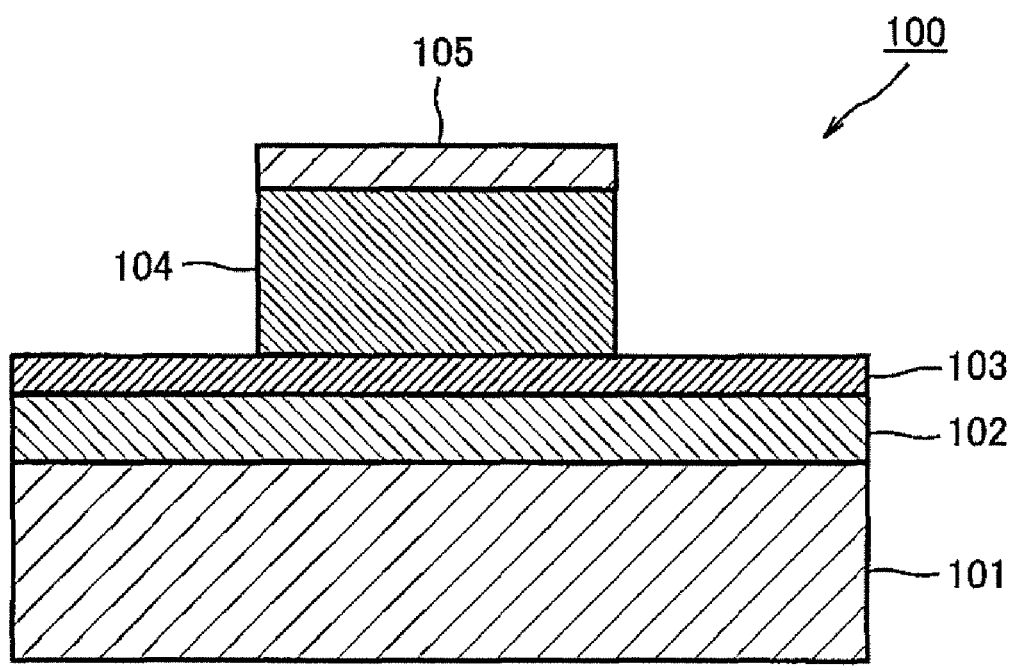
FIG. 1 is a cross-sectional view showing an example of a configuration of a nonvolatile memory element according to Embodiment 1 of the present invention.

| EXPLANATION OF REFERENCE NUMERALS | |
|---|---|
| 100 | nonvolatile memory element |
| 101 | substrate |
| 102 | insulating layer (oxide layer) |
| 103 | first electrode layer |
| 104 | resistance variable layer |
| 105 | second electrode layer |
| 200 | nonvolatile semiconductor apparatus |
| 201 | memory main section |
| 202 | memory array |
| 203 | row select circuit/driver |
| 204 | column select circuit/driver |
| 205 | write circuit |
| 206 | sense amplifier |
| 207 | data input/output circuit |
| 208 | address input circuit |
| 209 | control circuit |
| 210 | nonvolatile memory element (memory cell) |
| 211 | upper wire |
| 212 | lower wire |
| 213 | upper electrode |
| 214 | resistance variable layer |
| 215 | inner electrode |
| 216 | current suppressing element |
| 217 | lower electrode |

-continued

EXPLANATION OF REFERENCE NUMERALS

| | |
|---|---|
| 218 | ohmic resistance layer |
| 219 | second resistance variable layer |
| 300 | nonvolatile semiconductor apparatus |
| 301 | memory main section |
| 302 | memory array |
| 303 | row select circuit/driver |
| 304 | column select circuit |
| 305 | write circuit |
| 306 | sense amplifier |
| 307 | data input/output circuit |
| 308 | cell plate electric power supply |
| 309 | address input circuit |
| 310 | control circuit |
| 313 | nonvolatile memory element (memory cell) |
| 314 | upper electrode |
| 315 | resistance variable layer |
| 316 | lower electrode |
| 317 | plug layer |
| 318 | metal wire layer |
| 319 | source/drain region |
| 400 | nonvolatile semiconductor apparatus |
| 401 | semiconductor substrate |
| 402 | CPU |
| 403 | input/output circuit |
| 404 | logic circuit |
| 405 | analog circuit |
| 406 | BIST circuit |
| 407 | SRAM |
| 408 | relief address storage register |
| 409 | nonvolatile memory element |
| 410 | write circuit |
| 411 | read circuit |
| 412 | latch circuit |
| 421 | resistance variable layer |
| 422 | upper electrode |
| 423 | lower electrode |
| 424 | plug layer |
| 425 | metal wire layer |
| 426 | source/drain layer |
| BL0, BL1, . . . | bit lines |
| M111, M112, . . . | memory cells (nonvolatile memory element 210) |
| M211, M212, . . . | memory cells (nonvolatile memory element 313) |
| T11, T12, . . . | transistors |
| WL0, WL1, . . . | word lines |

BEST MODE FOR CARRYING OUT THE INVENTION

Hereinafter, embodiments of the present invention will be described in detail with reference to the drawings. Throughout the drawings, the same reference numerals are assigned to the same or corresponding parts and description thereof is omitted in some cases.

(Embodiment 1)

[Configuration of Nonvolatile Memory Element]

FIG. 1 is a cross-sectional view showing an example of a configuration of the nonvolatile memory element according to Embodiment 1 of the present invention.

As shown in FIG. 1, the nonvolatile memory element 100 includes a substrate 101, an insulating layer (oxide layer) 102 formed on the substrate 101, a first electrode layer 103 and a second electrode layer 105 which are formed on the insulating layer 102, and a resistance variable layer 104 sandwiched between the first electrode layer 103 and the second electrode layer 105.

When the nonvolatile memory element 100 is driven, electric signals (herein, e.g., voltage pulses) with predetermined conditions are applied between the first electrode layer 103 and the second electrode 105 from an external electric power supply. The resistance value of the resistance variable layer 104 of the nonvolatile memory element 100 increases or decreases according to the directions in which the voltages of the electric signals are applied. For example, when voltage pulses larger than predetermined threshold voltages are applied, the resistance values of the resistance variable layer 104 increases or decreases, whereas when voltage pulses smaller than the threshold voltages are applied, the resistance values of the resistance variable layer 104 will not change.

As materials for the first electrode layer 103 and the second electrode layer 105, for example, Pt (platinum), Ir (iridium), Cu (copper), Au (gold), Ag (silver), TaN (tantalum nitride), TiN (titanium nitride), and TiAlN (titanium aluminum nitride), may be used.

The resistance variable layer 104 comprises a tantalum oxynitride containing tantalum, oxygen and nitrogen as major components. That is, the resistance variable layer 104 comprises the tantalum oxynitride as the resistance variable material. The resistance variable layer 104 may comprise pure tantalum oxynitride or tantalum oxynitride containing additional elements. In other words, the resistance variable layer 104 comprises a compound containing tantalum, oxygen and nitrogen as major components. The resistance variable layer 104 may comprise a compound consisting of tantalum, oxygen and nitrogen, or a compound consisting of tantalum, oxygen, nitrogen and additional elements.

As the substrate 101, a silicon single crystal substrate or a semiconductor substrate may be used, but the substrate 101 is not limited to these. Since the resistance variable layer 104 can be formed at a relatively low substrate temperature, it can be formed on a material such as resin.

[Manufacturing Method of Nonvolatile Memory Element]

Subsequently, a manufacturing method of the nonvolatile memory element 100 of this embodiment will be described in detail.

Initially, on the substrate 101 which is a single crystal silicon, a $SiO_2$ layer having a thickness of 200 nm is formed as the insulating layer 102 by a thermal oxidation process. A Pt thin film having a thickness of 100 nm is formed as the first electrode layer 103 on the insulating layer 102 by a RF magnetron sputtering process. In this case, the film deposition conditions were such that a degree of vacuum was 1.0 Pa, an RF power was 250 W, an Ar flow rate was 10 sccm, and a film deposition time was 20 minutes.

Next, a tantalum oxynitride film which is the resistance variable layer 104 is formed on the first electrode layer 103 by a reactive RF sputtering process using a Ta target. The film deposition conditions in this case are shown on table 1.

TABLE 1

| Target | Ta |
|---|---|
| Degree of vacuum (Pa) | 0.2-5 (Pa) |
| Substrate heating temperature (° C.) | 20-400 (° C.) |
| Sputtering gas | $Ar + O_2 + N_2$ |
| $O_2 + N_2$ flow rate ratio (%) | 0.1-75 (%) |
| RF-Power (W) | 150-300 (W) |
| Film thickness (nm) | 1-300 (nm) |

Finally, a Pt thin film having a thickness of 150 nm is formed as the second electrode layer 105 on the resistance variable layer 104 by the RF sputtering process. The film deposition conditions in this case are identical to those for depositing the first electrode layer 103.

Alternatively, in formation of the resistance variable layer 104, a sputtering process which does not use reactive gases such as $N_2$ and $O_2$ may be employed by using the tantalum oxynitride as a target.

In further alternative, when the tantalum nitride is used as the first electrode layer or the second electrode layer, the resistance variable layer and the electrode layer can be formed successively using the same target. Hereinafter, a manufacturing method of the nonvolatile memory element 100 in the case where the second electrode layer is made of the tantalum nitride will be described.

Initially, on the substrate 101 which is a single crystal silicon, the insulating layer 102 having a thickness of 200 nm is formed by a thermal oxidation process. A Pt thin film having a thickness of 100 nm is formed as the first electrode layer 103 on the insulating layer 102 by the RF magnetron sputtering process. In this case, the film deposition conditions were such that a degree of vacuum was 1.0 Pa, an RF power was 250 W, an Ar flow rate was 10 sccm, and a film deposition time was 20 minutes.

Next, a tantalum oxynitride film which is the resistance variable layer 104 is formed on the first electrode layer 103. In the film deposition, a reactive RF sputtering process using a Ta target was used. The film deposition conditions in this case are, similar to the above mentioned case, shown on table 1.

Finally, the second electrode layer was deposited by the reactive RF sputtering process using the Ta target. The sputtering gas is Ar+$N_2$. The flow rate ratio of $N_2$ gas with respect to a total flow rate was set to 20%.

In this way, in the case where the tantalum nitride is used as the first electrode layer or the second electrode layer, the manufacturing process can be simplified.

[Analysis of Tantalum Oxynitride Film]

The resistance value and composition of the tantalum oxynitride film formed as the resistance variable layer 104 by the above mentioned reactive RF sputtering process were measured. The result is illustrated below.

In the case where the flow rates of argon and nitrogen were set to constant values which are 44 sccm and 5 sccm, respectively, the resistivity of the tantalum oxynitride film was 2.3 milliohm centimeter when the flow rate of oxygen is set to 6 sccm. When the flow rate of oxygen was set to 8 sccm, the resistivity of the tantalum oxynitride film was 12.6 milliohm centimeter. From this, it may be determined that the resistivity of the tantalum oxynitride film can be controlled by controlling the flow rate of oxygen and the flow rate of nitrogen.

Figure 18:
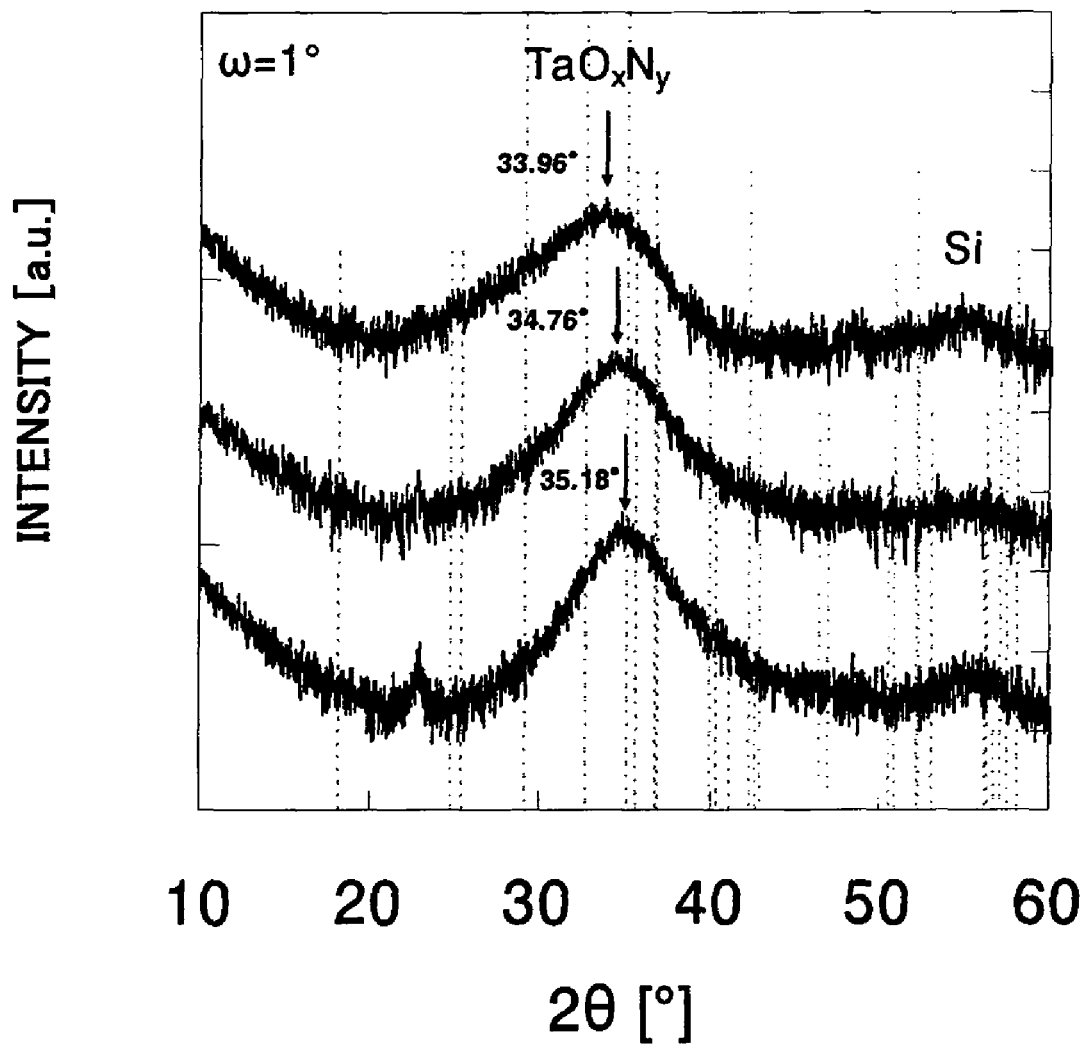
FIG. 18 is a XRD chart of a resistance variable layer forming the nonvolatile memory element according to Embodiment 1 of the present invention.

FIG. 18 is a XRD (X-ray diffraction) chart of the tantalum oxynitride film. In FIG. 18, three curves are XRD charts of the tantalum oxynitride film in cases where the flow rates of oxygen are set to 6 scmm, 7 sccm, and 8 scmm in this order from below in a state where the flow rate of argon and the flow rate of nitrogen are set to constant values which are 44 sccm and 5 sccm, respectively. According to the XRD charts, broad peaks are observed in a range where 2θ is approximately 34 to 35 degrees. Therefore, these tantalum oxynitrides are presumed as being amorphous. The peak positions of the XRD charts shift to a smaller angle side as the flow rate of oxygen increases.

The compositions of these tantalum oxynitride films were analyzed by Rutherford back scattering method. In the tantalum oxynitride film in the case where the oxygen flow rate is 6 sccm, tantalum/oxygen/nitrogen are 37.5/32.5/30 atm %, respectively, and the composition of the tantalum oxynitride film is expressed as $TaO_{0.86}N_{0.8}$. In the tantalum oxynitride film in the case where the oxygen flow rate is 8 sccm, tantalum/oxygen/nitrogen are 34.5/37.6/27.9 atm %, respectively, and the composition of the tantalum oxynitride film is expressed as $TaO_{1.1}N_{0.8}$.

[Example of Operation of Nonvolatile Memory Element]

Subsequently, an example of the operation of the nonvolatile memory element 100 according to Embodiment as a memory, i.e., an example of the operation which occurs when write/read data will be described with reference to the drawings.

Figure 2:
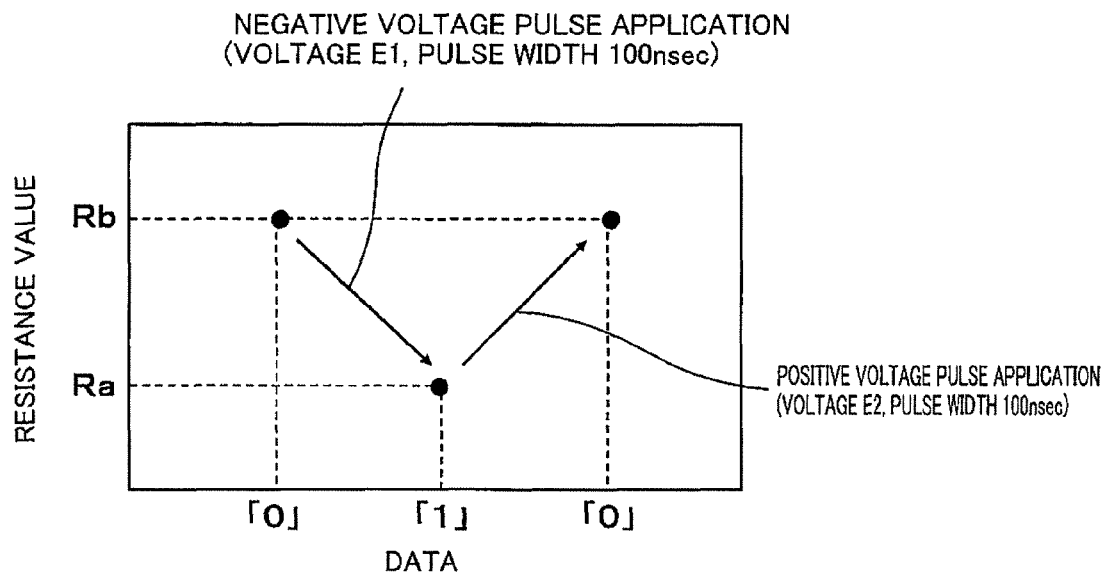
FIG. 2 is a diagram showing an example of the operation of the nonvolatile memory element according to Embodiment 1 of the present invention, which occurs when writing data.

FIG. 2 is a diagram showing an example of the operation of the nonvolatile memory element according to Embodiment 1 of the present invention, which occurs when writing data.

Figure 3:
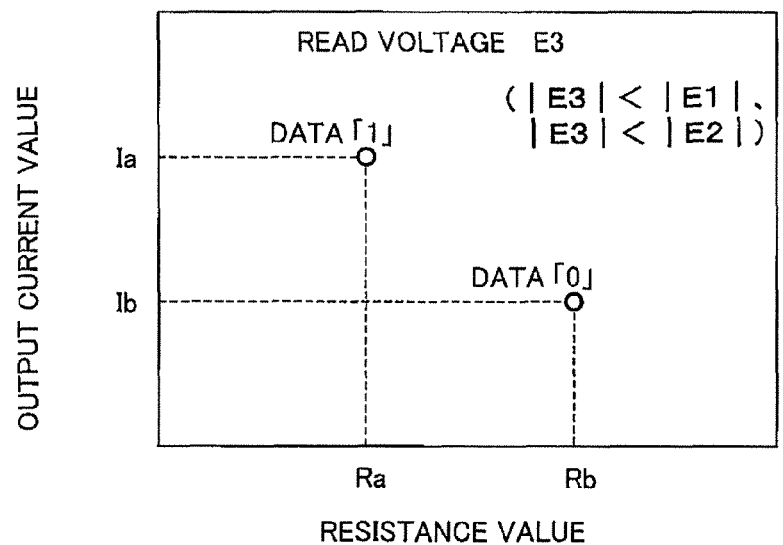
FIG. 3 is a diagram showing an example of the operation of the nonvolatile memory element according to Embodiment 1 of the present invention, which occurs when reading data.

When two kinds of electric pulses having different polarities and a pulse width of 100 nsec are applied alternately between the first electrode layer 103 and the second electrode layer 105 (hereinafter sometimes expressed as "between the electrodes"), the resistance values of the resistance variable layer 104 switches as shown in FIG. 3. To be specific, when a negative voltage pulse (voltage E1, pulse width 100 nsec) is applied between the electrodes, the resistance value of the resistance variable layer 104 decreases from a high-resistance value Rb to a low-resistance value Ra. On the other hand, when a positive voltage pulse (voltage E2, pulse width 100 nsec) is applied between the electrodes, the resistance value of the resistance variable layer 104 increases from the low-resistance value Ra to the high-resistance value Rb. In this case, the voltage E1 is −2.0V and the voltage E2 is +3.0V.

In the example shown in FIG. 2, the high-resistance value Rb is allocated to data "0" and the low-resistance value Ra is allocated to data "1." Therefore, the data "0" is written by applying the positive voltage pulse between the electrodes so that the resistance value of the resistance variable layer 104 reaches the high-resistance value Rb, while the data "1" is written by applying the negative voltage pulse between the electrodes so that the resistance value reaches the low-resistance value Ra.

FIG. 3 is a diagram showing an example of the operation of the nonvolatile memory element according to Embodiment 1 of the present invention, which occurs when reading data.

When reading data, a read voltage E3 ($|E3|<|E1|$, $|E3|<|E2|$) which has an amplitude smaller than that of the electric pulse applied to switch the resistance value of the resistance variable layer 104 is applied between the electrodes. As a result, a current corresponding to the resistance value of the resistance variable layer 104 is output, and its output current value is detected, thereby enabling reading of the written data.

In the example illustrated in FIG. 3, since an output current value Ia corresponds to the resistance value Ra and an output current value Ib corresponds to the resistance value Rb, the data "1" is read when the output current value Ia is detected, while the data "0" is read when the output current value Ib is detected.

Since the resistance variable layer 104 serves as a memory portion in a region sandwiched between the first electrode layer 103 and the second electrode layer 104 in the manner described above, the nonvolatile memory element 100 operates as a memory.

[Resistance Variable Characteristic of Nonvolatile Memory Element]

Subsequently, the resistance variable characteristic in a case where electric pulses are applied to the nonvolatile memory element 100 according to this embodiment will be described.

Figure 19A:
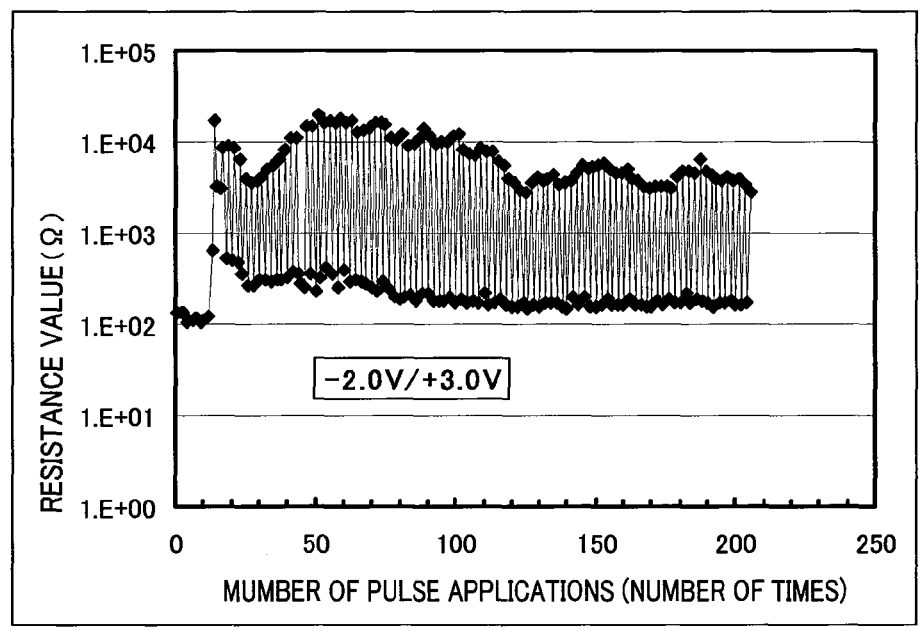
FIG. 19(*a*) is a graph showing the relationship between the resistance value of the resistance variable layer included in the nonvolatile memory element according to Embodiment 1 of the present invention and the number of pulse applications.
Figure 19B:
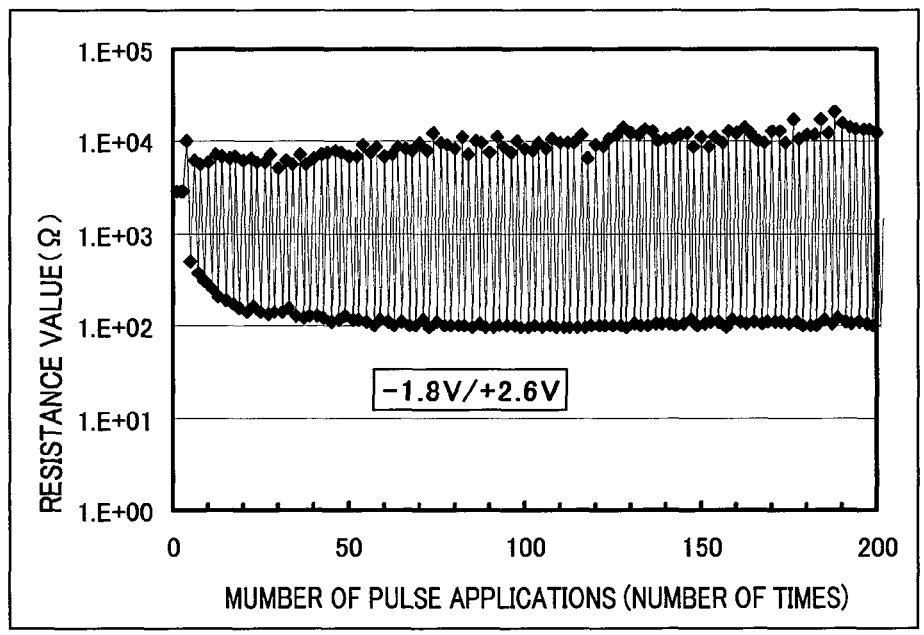
Figure 19C:
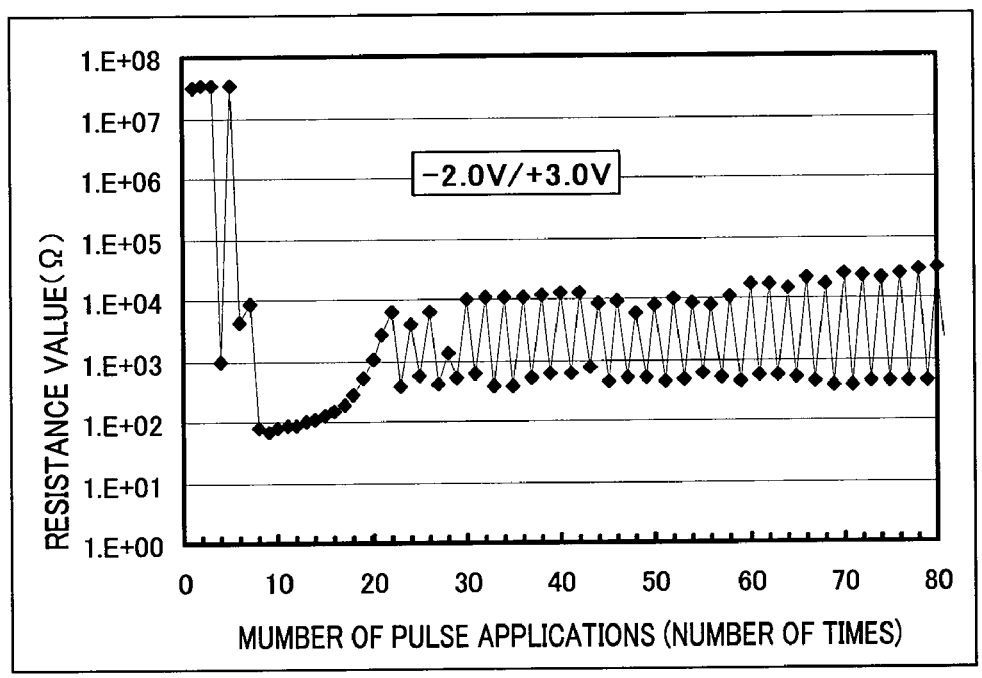

FIG. 19(a) to FIG. 19(c) are graphs showing the relationship between the resistance value of the resistance variable layer 104 included in the nonvolatile memory element according to Embodiment 1 of the present invention and the number of pulse applications. FIGS. 19(a) to 10(c) show the results obtained when two kinds of electric pulses (herein pulse voltages) having different polarities and a pulse width of 100 nsec are applied alternately between the first electrode layer 103 and the second electrode layer 105. FIG. 19(a)

shows the resistance variable characteristic of the tantalum oxynitride film in a case where the flow rate of argon, the flow rate of nitrogen, and the flow rate of oxygen are 44 sccm, 5 sccm, and 7 sccm, respectively. FIG. 19(b) shows the resistance variable characteristic of the tantalum oxynitride film in a case where the flow rate of argon, the flow rate of nitrogen, and the flow rate of oxygen are 44 sccm, 5 sccm, and 8 sccm, respectively. FIG. 19(c) shows the resistance variable characteristic of the tantalum oxynitride film in a case where the flow rate of argon, the flow rate of nitrogen, and the flow rate of oxygen are 44 sccm, 5 sccm, and 7 sccm, respectively and plasma oxidation treatment is performed as a post treatment. Therefore, it is presumed that the oxygen content rate of the tantalum oxynitride film in the example of FIG. 19(c) is higher than the oxygen content rate of the tantalum oxynitride film in the example of FIG. 19(a) and the oxygen content rate of the tantalum oxynitride film in the example of FIG. 19(b).

By applying two kinds of electric pulses alternately between the electrodes as described above, the resistance value of the resistance variable layer 104 switched reversibly as shown in FIG. 19(a). To be specific, when a negative voltage pulse (voltage −2.0V, pulse width 100 nsec) is applied between the electrodes, the resistance value of the resistance variable layer 104 decreases to about 200 ohm in average (300 to 170 ohm) (low-resistance value), while when a positive voltage pulse (voltage +3.0V, pulse width 100 nsec) is applied between the electrodes, the resistance value of the resistance variable layer 104 increases up to about 5500 ohm in average (11000 to 4000 ohm) (high-resistance value). As used herein, the term "application of the negative voltage" means that the negative voltage is applied to the second electrode (upper electrode) 105 when the voltage of the first electrode (lower electrode) 103 is used as a reference, while the term "application of the positive voltage" means that the positive voltage is applied to the second electrode (upper electrode) 105 when the voltage of the first electrode (lower electrode) 103 is used as a reference. Such resistance switching continued stably even though the pulses were applied continuously about 150 times. The initial resistance value of the element was 133 ohm.

From the above result, it can be confirmed that a resistance variable nonvolatile memory element having a stably reversible rewrite characteristic with a low voltage is attainable by using the resistance variable layer 104.

FIG. 19(a) shows the result of the resistance variable layer 104 having a film thickness of 25 nm and a circular pattern of a diameter 2 μm. Hereinbelow, the resistance variable layer 104 will be described as having such a size, except for special cases.

FIG. 19(b) shows the relationship between the resistance value of the resistance variable layer which occurs when the electric pulse is applied between the electrodes continuously and the number of applications of the electric pulse in a case where the initial resistance value of the element is 2870 ohm. The resistance variable layer is caused to have a low-resistance value of about 320 ohm in average (370 to 230 ohm) by applying −2.5V and is caused to have a high-resistance value of about 9000 ohm in average (18000 to 6000Ω) by applying +3.0V. Such resistance switching continued stably even when the pulses were applied continuously about 80 times. From the result shown in FIG. 19(b), the nonvolatile memory element according to this embodiment operates with an electric pulse of 100 nsec.

FIG. 19(c) shows the relationship between the resistance value of the resistance variable layer which occurs when the electric pulse is applied continuously between the electrodes and the number of applications of the electric pulse in a case where the initial resistance value of the element is $3.1 \times 10^7$ ohm. The resistance variable layer is caused to have a low-resistance value of about 500 ohm in average (600 to 380 ohm) by applying −2.V and is caused to have a high-resistance value of about 11000 ohm in average (19000 to 8000 ohm) by applying +3.0V. Such resistance switching continued stably even when the pulses were applied continuously about 50 times. From the result shown in FIG. 19(c), it can be seen that the nonvolatile memory element according to this embodiment operates with an electric pulse of 100 nsec.

From these results, the resistance variable layer has a resistance variable region with respect to the initial resistance value of the element. For this reason, when forming the resistance variable layer in the nonvolatile memory element of this embodiment, matching with a semiconductor process for forming other circuit region is easily achieved by controlling the film thickness of the resistance variable layer.

[Summary of Embodiment 1]

The nonvolatile memory element 100 according to Embodiment 1 uses tantalum oxynitride $TaO_xN_y$ as the resistance variable material. A mechanism that the tantalum oxynitride $TaO_xN_y$ exhibits the resistance variable characteristic in response to the electric pulse is not made clear at the present moment. However, from the results (FIGS. 19(a) to 19(c)) obtained from measurement of the resistance variable characteristic conducted by changing the oxygen content rate of the tantalum oxynitride $TaO_xN_y$, it can be seen that they exhibit stable resistance variable characteristic. Therefore, it is presumably recognized that the tantalum oxynitride $TaO_xN_y$ exhibits the resistance variable characteristic regardless of the content rates of oxygen O and nitrogen N.

From the measurement results of the resistance variable characteristics of FIGS. 19(a) to 19(c), it may be said that the initial resistance value of the nonvolatile memory element 100 is desirably at least not smaller than 133 ohm and not larger than $3.1 \times 10^7$ ohm.

According to the above mentioned composition analysis result, in the tantalum oxynitride film in the case where the flow rate of argon, the flow rate of nitrogen and the flow rate of oxygen are 44 sccm, 5 sccm, and 6 sccm, respectively, tantalum/oxygen/nitrogen are 37.5/32.5/30 atm %, respectively, and the content ratio of oxygen with respect to nitrogen in the tantalum oxynitride with this composition is 1.08. In the tantalum oxynitride film in the case where the flow rate of argon, the flow rate of nitrogen and the flow rate of oxygen are 44 sccm, 5 sccm, and 8 sccm, respectively, the tantalum/oxygen/nitrogen are 34.5/37.6/27.9 atm %, respectively, and the content ratio of oxygen with respect to nitrogen in the tantalum oxynitride with this composition is 1.35. It is confirmed that tantalum oxynitride film in the case where the flow rate of argon, the flow rate of nitrogen and the flow rate of oxygen are 44 sccm, 5 sccm, and 8 sccm, respectively, exhibits the stable resistance variable characteristic as shown in FIG. 19(b). On the other hand, for the tantalum oxynitride film in the case where the flow rate of argon, the flow rate of nitrogen and the flow rate of oxygen are 44 sccm, 5 sccm, and 6 sccm, respectively, its resistance variable characteristic is not confirmed. But, it is confirmed that the tantalum oxynitride film in the case where the flow rate of argon, the flow rate of nitrogen and the flow rate of oxygen are 44 sccm, 5 sccm, and 7 sccm, in which the oxygen flow rate in the film deposition condition is near that of the tantalum oxynitride film in the case where the flow rate of argon, the flow rate of nitrogen and the flow rate of oxygen are 44 sccm, 5 sccm, and 6 sccm, respectively, exhibits stable resistance variable characteristic as shown in FIG. 19(a). From this, it is presumably recognized that the tantalum oxynitride film in the case where the flow rate of argon, the flow rate of nitrogen and the flow rate of oxygen are 44 sccm, 5 sccm, and 6 sccm, respectively, exhibits a stable resistance variable characteristic. Therefore, it may be said that the content ratio of oxygen with respect to nitrogen in the resistance variable layer 104 of the nonvolatile memory element 100 is desirably not smaller than 1.08 and not larger than 1.35.

It is a general method to those skilled in the art that some element is added to tantalum oxynitride which is a resistance variable material to improve its characteristic, etc. Of course, this may be done. Needless to say, this may fall within a scope of the present invention, so long as the tantalum oxynitride containing additional elements exhibits the resistance variable characteristic. Furthermore, it is natural that the resistance variable layer 104 contains some impurities in addition to the tantalum oxynitride. Needless to say, this may fall within a scope of the present invention, so long as the resistance variable layer 104 containing some impurities exhibits the resistance variable characteristic, as well.

(Embodiment 2)

The above described nonvolatile memory element according to Embodiment 1 is applicable to nonvolatile semiconductor apparatuses having various configurations. A semiconductor apparatus according to Embodiment 2 is a nonvolatile semiconductor apparatus which includes the nonvolatile memory element according to Embodiment 1 and is so-called a cross-point memory apparatus in which an active layer intervenes at an intersection (three-dimensional cross point) between a word line and a bit line.

[Configuration of Semiconductor Apparatus According to Embodiment 2]

Figure 4:
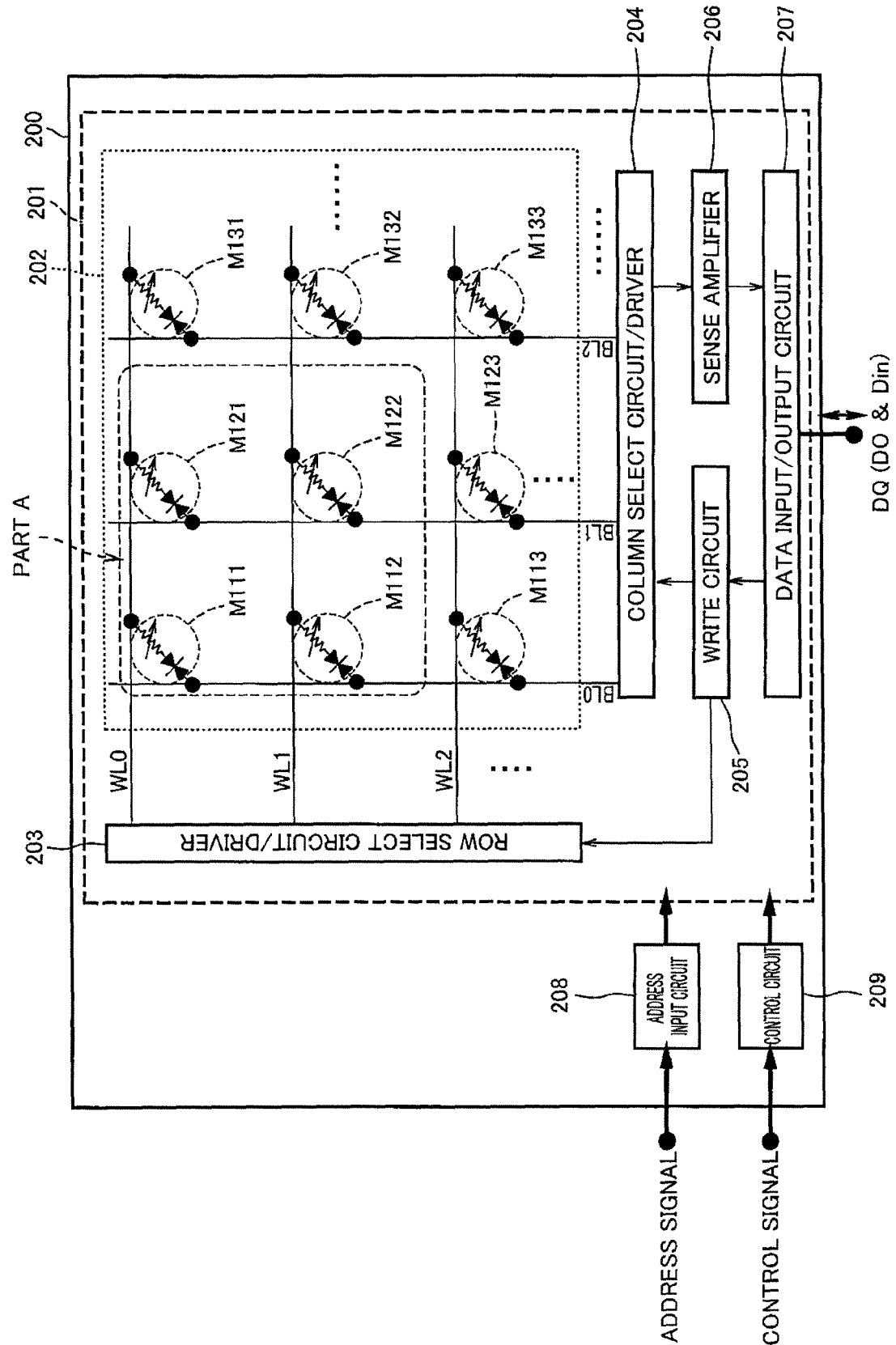
FIG. 4 is a block diagram showing a configuration of a nonvolatile semiconductor apparatus according to Embodiment 2 of the present invention.

FIG. 4 is a block diagram showing a configuration of a nonvolatile semiconductor apparatus according to Embodiment 2 of the present invention. FIG. 3 is a perspective view showing a configuration (configuration corresponding to 4 bits) in part A of FIG. 4.

As shown in FIG. 4, a nonvolatile semiconductor apparatus 200 according to this embodiment includes a memory main section 201 on a semiconductor substrate. The memory main section 201 includes a memory array 202, a row select circuit/driver 203, a column select circuit/driver 204, a write circuit 205 for writing data, a sense amplifier 206 which detects an amount of a current flowing in a selected bit line and determines the data as "1" or "0," and a data input/output circuit 207 which executes input/output processing of input/output data via a terminal DQ. The nonvolatile semiconductor apparatus 200 further includes an address input circuit 208 which receives an address signal externally input, and a control circuit 209 for controlling the operation of the memory main section 201, based on a control signal externally input.

Figure 5:
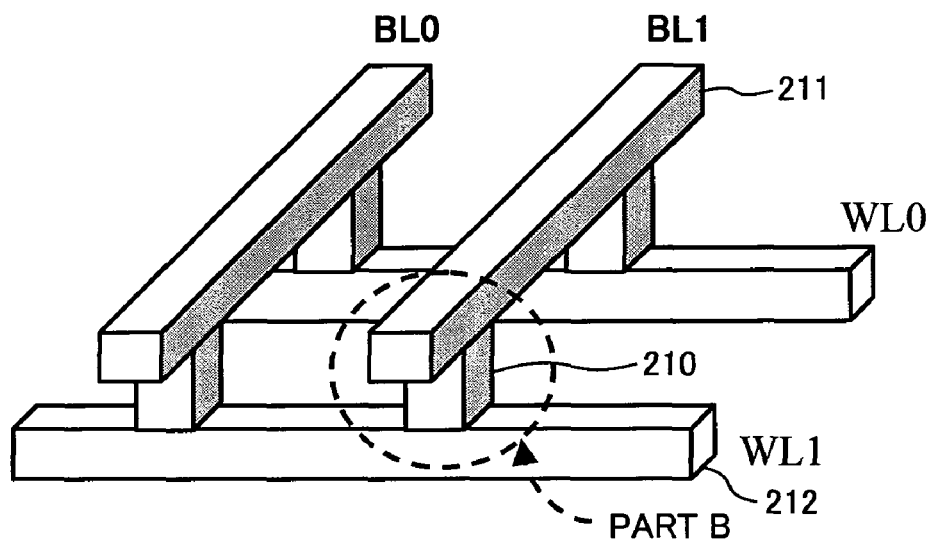
FIG. 5 is a perspective view showing a configuration (configuration corresponding to 4 bits) in part A of FIG. 4.

As shown in FIGS. 4 and 5, the memory array 202 includes plural word lines WL0, WL1, WL2, . . . which are formed on the semiconductor substrate to extend in parallel with each other, and plural bit lines BL0, BL1, BL2, . . . which are formed above the plural word lines WL0, WL1, WL2, . . . , so as to extend in parallel with each other within a plane parallel to a main surface of the semiconductor substrate and so as to three-dimensionally cross the plural word lines WL0, WL1, WL2, . . . .

Further, plural memory cells M111, M112, M113, M121, M122, M123, M131, M132, M133, . . . (hereinafter expressed as "memory cells M111, MC112, . . . ") are arranged in matrix so as to respectively correspond to the three-dimensional cross points of the plural word lines WL0, WL1, WL2, . . . , and the plural bit lines BL0, BL1, BL2 . . . .

The memory cells M111, M112, . . . correspond to the nonvolatile memory elements according to Embodiment 1, and each of them has a resistance variable layer comprising tantalum oxynitride. It should noted that in this embodiment, each of these memory cells M111, M112, . . . includes a current suppressing element as described later.

The memory cells M111, M112, . . . in FIG. 4 are identified by reference numeral 210 in FIG. 5.

The address input circuit 208 receives an address signal from an external circuit (not shown), and outputs a row address signal and a column address signal to the row select circuit/driver 203 and to the column select circuit/driver 204, respectively, based on the address signal. The address signal is a signal indicating the address of a specified memory cell to be selected from among the plural memory cells M111, M112, . . . . The row address signal is a signal indicating the a row address in the address indicated by the address signal, and the column address signal is a signal indicating a column address in the address indicated by the address signal.

In a write cycle of data, the control circuit 209 outputs to the write circuit 205, a write signal for causing application of a write voltage, according to the input data Din input to the data input/output circuit 207. In a read cycle of data, the control circuit 209 outputs to the column select circuit/driver 204 a read signal for causing application of a read voltage.

The row select circuit/driver 203 receives the row address signal output from the address input circuit 208, selects one from among the plural word lines WL0, WL1, WL2, . . . based on the row address signal and applies a predetermined voltage to the selected word line.

The column select circuit/driver 204 receives a column address signal output from the address input circuit 208, selects one from among the plural bit lines BL0, BL1, BL2, . . . based on the column address signal and applies the write voltage or the read voltage to the selected bit line.

Receiving the write signal output from the control circuit 209, the write circuit 205 outputs to the row select circuit/driver 203, a signal for causing application of a voltage to the selected word line, and outputs to the column select circuit/driver 204 a signal for causing application of a write voltage to the selected bit line.

In the read cycle of data, the sense amplifier 206 detects an amount of a current flowing in the selected bit line which is a read target, and determines the data as "1" or "0." The resulting output data DO is output to the external circuit via the data input/output circuit 207.

[Configuration of Nonvolatile Memory Element Included in Nonvolatile Semiconductor Apparatus According to Embodiment 2]

Figure 6:
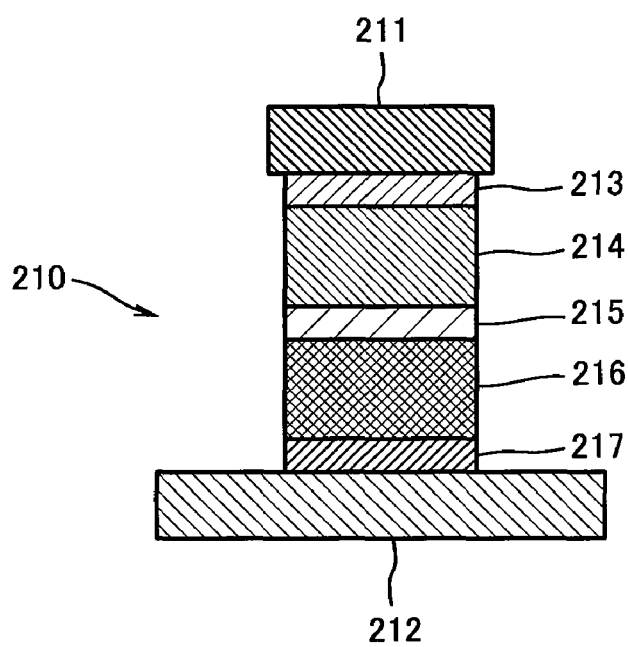
FIG. 6 is a cross-sectional view showing a configuration of a nonvolatile memory element included in a nonvolatile semiconductor apparatus according to Embodiment 2 of the present invention.

FIG. 6 is a cross-sectional view showing a configuration of the nonvolatile memory element included in the nonvolatile semiconductor apparatus according to Embodiment 2 of the present invention. In FIG. 6, a configuration of part B in FIG. 5 is shown.

As shown in FIG. 6, a nonvolatile memory element 210 included in the nonvolatile semiconductor apparatus according to this embodiment intervenes between a lower wire 212 (corresponding to the word line WL1 in FIG. 5) which is a copper wire and an upper wire 211 (corresponding to the bit line BL1 in FIG. 5) which is a copper wire, and includes a lower electrode 217, a current suppressing element 216, an inner electrode 215, a resistance variable layer 214, and an upper electrode 213 which are laminated in this order.

The inner electrode 215, the resistance variable layer 214, and the upper electrode 213 correspond to the first electrode layer 103, the resistance variable layer 104, and the second electrode layer 105 in the nonvolatile memory element 100 according to Embodiment 1 shown in FIG. 1, respectively. Therefore, the resistance variable layer 214 is formed as in Embodiment 1.

The current suppressing element 216 is connected in series to the resistance variable layer 214 via the inner electrode 215 made of TaN. The current suppressing element 216 is an element which is typically a MIM (Matal-Insulator-Metal) diode or a MSM (Metal-Semiconductor-Metal) diode, and exhibits a nonlinear current characteristic with respect to a voltage. The current suppressing element 216 has a bidirectional current characteristic with respect to a voltage, and is placed in a conductive state under a predetermined threshold voltage Vf (e.g., not lower than +1V or not higher than −1V based on one electrode as a reference).

Tantalum and tantalum oxide are materials generally used in a semiconductor process, and may be highly compatible with the semiconductor process. Therefore, they can be easily incorporated into the existing semiconductor manufacturing process.

[Configuration of Modification of Nonvolatile Memory Element Included in Nonvolatile Semiconductor Apparatus According to Embodiment 2]

The configuration of the nonvolatile memory element included in the nonvolatile semiconductor apparatus according to this embodiment is not limited to that shown in FIG. 6, but may have a configuration shown below.

FIGS. 5(a) to 5(g) are cross-sectional views showing configurations of modifications of the nonvolatile memory element included in the nonvolatile semiconductor apparatus according to Embodiment 2 of the present invention.

FIG. 7(a) shows a configuration in which the resistance variable layer 214 is formed on the current suppressing element 216, and the inner electrode is omitted, unlike the configuration of FIG. 6.

FIG. 7(b) shows a configuration in which the resistance variable layer 214 is formed on the current suppressing element 216, and the lower electrode, the inner electrode, and the upper electrode are omitted, unlike the configuration of FIG. 6. FIG. 7(c) shows a configuration in which the lower electrode is omitted, unlike the configuration of FIG. 6. Alternatively, a configuration in which the upper electrode is omitted may be used.

FIG. 7(d) shows a configuration in which the inner electrode and the current suppressing element are omitted, unlike the configuration of FIG. 6. FIG. 7(e) shows a configuration in which the upper electrode and the lower electrode are further omitted.

FIG. 7(f) shows a configuration in which the inner electrode is omitted but instead an ohmic resistance layer 218 is provided unlike the configuration of FIG. 6. FIG. 7(g) shows a configuration in which a second resistance variable layer 219 is provided instead of the inner electrode.

In the above modifications, in the configuration in which the upper electrode is omitted, the upper wire 211 serves as the upper electrode of the nonvolatile memory element, while in the configuration in which the lower electrode is omitted, the lower wire 212 serves as the lower electrode of the nonvolatile memory element.

When the memory cells are fewer in number, a current flowing to unselected memory cells due to cross-talk is reduced. In that case, the above described current suppressing element may be dispensed with.

As should be understood from the above, for the nonvolatile memory elements included in the nonvolatile semiconductor apparatus according to this embodiment, various configurations may be used.

[Example of Configuration of Nonvolatile Semiconductor Apparatus Having a Multi-Layer Structure]

Figure 7:
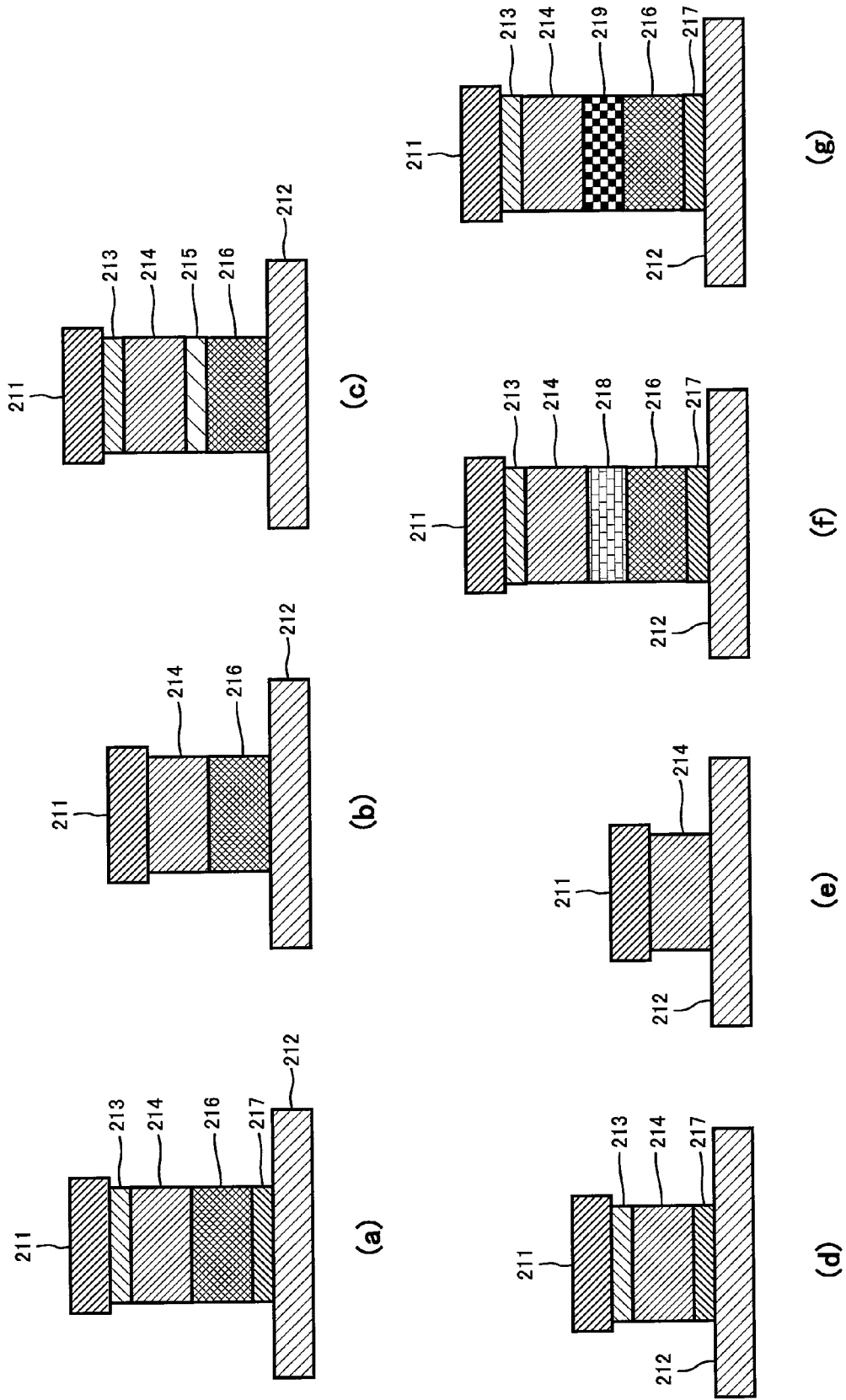
FIG. 7 is a cross-sectional view showing a configuration of a modification of the nonvolatile memory element included in the nonvolatile semiconductor apparatus according to Embodiment 2 of the present invention.

The memory arrays of the nonvolatile semiconductor apparatus according to this embodiment shown in FIGS. 6 and 7 may be three-dimensionally stacked to attain a nonvolatile semiconductor apparatus having a multi-layer structure.

Figure 8:
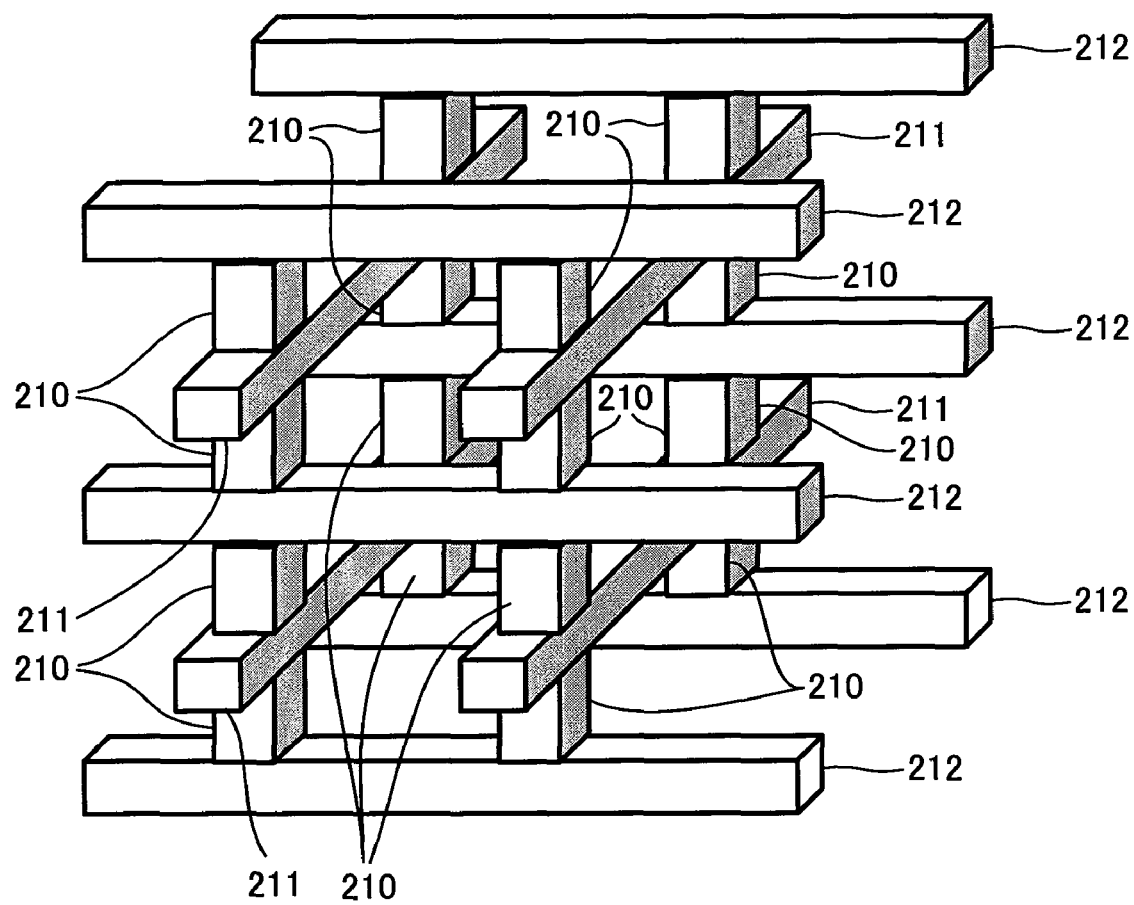
FIG. 8 is a perspective view showing a configuration of a memory array included in a nonvolatile semiconductor apparatus having a multi-layer structure of the present invention.

FIG. 8 is a perspective view showing a configuration of a memory array included in the nonvolatile semiconductor apparatus having the multi-layer structure of the present invention. As shown in FIG. 8, the nonvolatile semiconductor apparatus includes a multi-layer memory array having plural layers of stacked memory arrays each including plural lower wires 212 formed on a semiconductor substrate (not shown), to extend in parallel with each other, plural upper wires 211 formed above the plural lower wires 212 so as to extend in parallel with each other within a plane parallel to a main surface of the semiconductor substrate and so as to three-dimensionally cross the plural lower wires 212, and plural memory cells 210 arranged in matrix to respectively correspond to three-dimensional cross points of the plural lower wires 212 and the plural upper wires 211.

In the example shown in FIG. 8, the wire layers are formed in five layers and the nonvolatile memory elements arranged at the three-dimensional cross points are formed in four layers. Alternatively, the number of these layers may be increased or decreased as desired.

By providing the multi-layer memory array configured as described above, a nonvolatile memory having a super-large capacity is attainable.

As already described in Embodiment 1, the resistance variable layer of the present invention can be formed at a low temperature. Therefore, transistors or wire material such as silicide formed in a lower layer step are not affected even when a layer structure is formed in a wiring step illustrated in this embodiment. As a result, a multi-layer memory array is easily attainable. That is, a nonvolatile semiconductor apparatus having a multi-layer structure can be easily attained by using the resistance variable layer comprising the tantalum oxynitride of the present invention.

[Example of Operation of Nonvolatile Semiconductor Apparatus]

Subsequently, an example of the operation of the nonvolatile semiconductor apparatus according to Embodiment 2 in a write cycle in which data is written and in a read cycle in which data is read, will be described with reference to a timing chart shown in FIG. 9.

Figure 9:
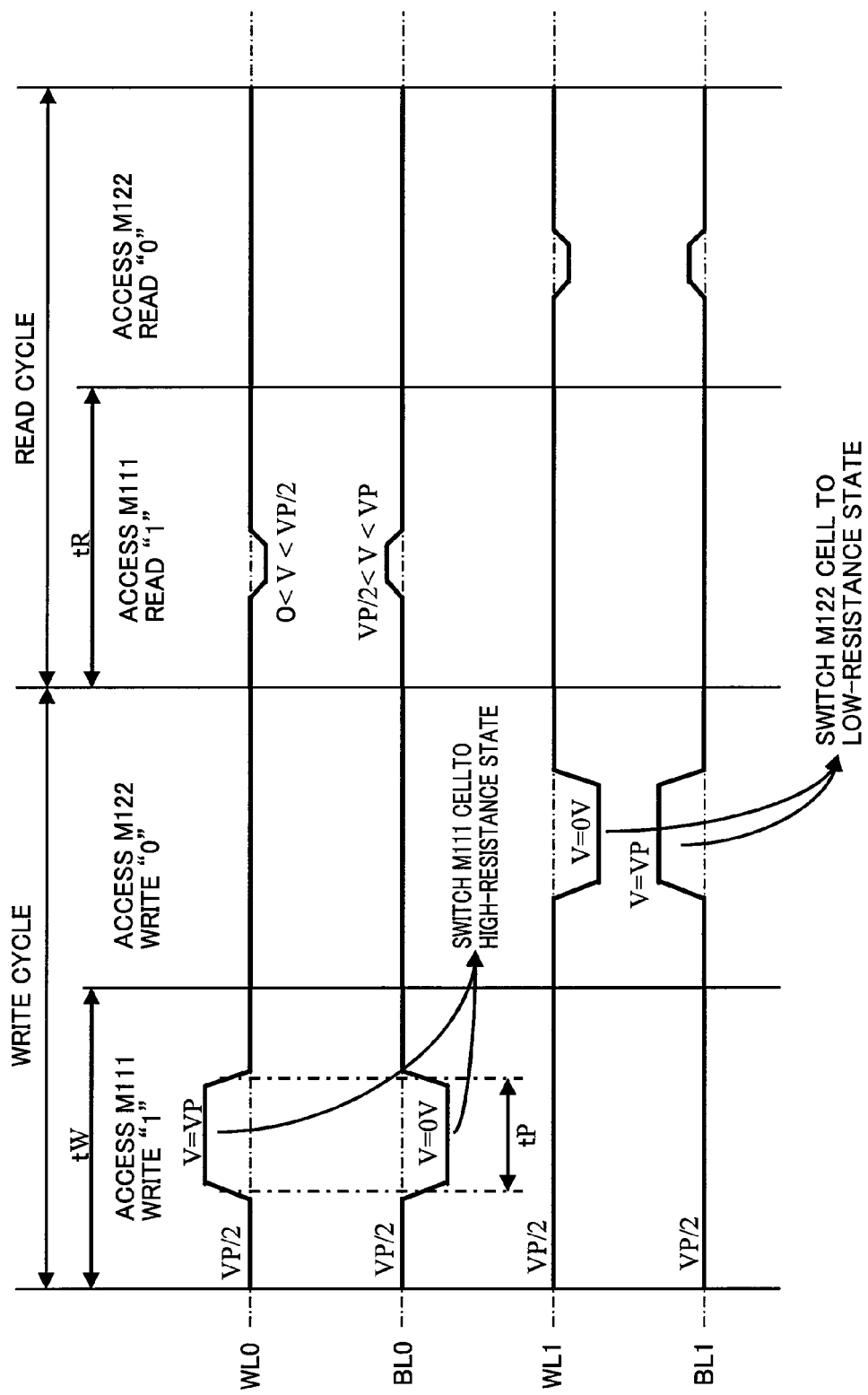
FIG. 9 is a timing chart showing an example of the operation of the nonvolatile semiconductor apparatus according to Embodiment 2 of the present invention.

FIG. 9 is a timing chart showing an example of the operation of the nonvolatile semiconductor apparatus according to Embodiment 2 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, only writing and reading of data with respect to the memory cells M111 and M122 will be described.

VP in FIG. 9 denotes a pulse voltage required to enable the memory cell including the resistance variable element and the current suppressing element to switch its resistance. It is desired that a relationship VP/2<threshold voltage Vf be established. This is because, this relationship can suppress a leak current flowing to a unselected memory cells due to crosstalk. This makes it possible to reduce an undesired current supplied to memory cells which do not require writing of data, facilitating achievement of low electric power consumption. In addition, unintended unsufficient writing (generally referred to as disturb) to the unselected memory cells is advantageously suppressed.

In FIG. 9, tW denotes a write cycle time which is a time required for one write cycle, and tR denotes a read cycle time which is a time required for one read cycle.

In a write cycle for the memory cell M111, a pulse voltage VP having a pulse width tP is applied to the word line WL0, and according to this timing, a voltage of 0V is applied to the bit line BL0 in the same manner. In this way, a write voltage for writing data "1" is applied to the memory cell M111, causing the resistance variable layer in the memory cell M111 to switch to the high-resistance state. That is, the data "1" is written to the memory cell M111.

Then, in a write cycle for the memory cell M122, a voltage of 0V and a pulse width tP is applied to the word line WL1, and according to this timing, the pulse voltage VP is applied to the bit line BL1 in the same manner. In this way, a write voltage for writing data "0" is applied to the memory cell M122, causing the resistance variable layer in the memory cell M122 to switch to the low-resistance state. That is, the data "0" is written to the memory cell M122.

In a read cycle for the memory cell M111, a pulse voltage which has an amplitude smaller than that of the pulse for writing and has a value larger than 0V and smaller than VP/2 is applied to the word line WL0. According to this timing, a pulse voltage which has an amplitude smaller than that of the pulse for writing and has a value larger than VP/2 and smaller than VP is applied to the bit line BL0. Thereby, a current corresponding to the resistance value of the resistance variable layer 214 in the memory cell M111 switched to the high-resistance state is output, and its output current value is detected, so that the data "1" is read.

Then, in a read cycle for the memory cell M122, a voltage identical to that in the previous read cycle for the memory cell M111 is applied to the word line WL1 and the bit line BL1. Thereby, a current corresponding to the resistance value of the resistance variable layer 214 in the memory cell M122 switched to the low-resistance state is output, and its output current value is detected, so that the data "0" is read.

Although not shown in this embodiment, redundant relief memory cells having the same configuration as the memory cells are typically provided to relieve faulty memory cells in memory apparatuses. In addition, memory cells for parity bits for error correction are provided as a part of a memory array, or otherwise, a memory array including the memory cells for parity bits are separately provided. In this embodiment, those memory cells may be provided separately. In that case, as the memory cells, the nonvolatile memory elements of the present invention may be used. Having described an example in which the voltage value of the high-resistance state attaining pulse and the voltage value of the low-resistance state attaining pulse are equal, an optimal pulse voltage is sometimes different between the voltage value of the high-resistance state attaining pulse and the voltage value of the low-resistance state attaining pulse, as described in Embodiment 1. In that case, an optimal pulse voltage value may be set for each of the high-resistance state attaining pulse and the low-resistance state attaining pulse.

In this embodiment, only the cross-point structure formed by integration on the semiconductor substrate is described. Alternatively, the cross-point structure may be formed on a more inexpensive substrate such as a plastic substrate, in place of the semiconductor substrate, and may be applied to a memory apparatus which has a layer structure formed by an assembling method using bumps or the like.

(Embodiment 3)

A nonvolatile semiconductor apparatus according to Embodiment 3 is a nonvolatile semiconductor apparatus which includes the nonvolatile memory element according to Embodiment 1, and is of a one transistor/one nonvolatile memory portion type.

[Configuration of Nonvolatile Semiconductor Apparatus According to Embodiment 3]

Figure 10:
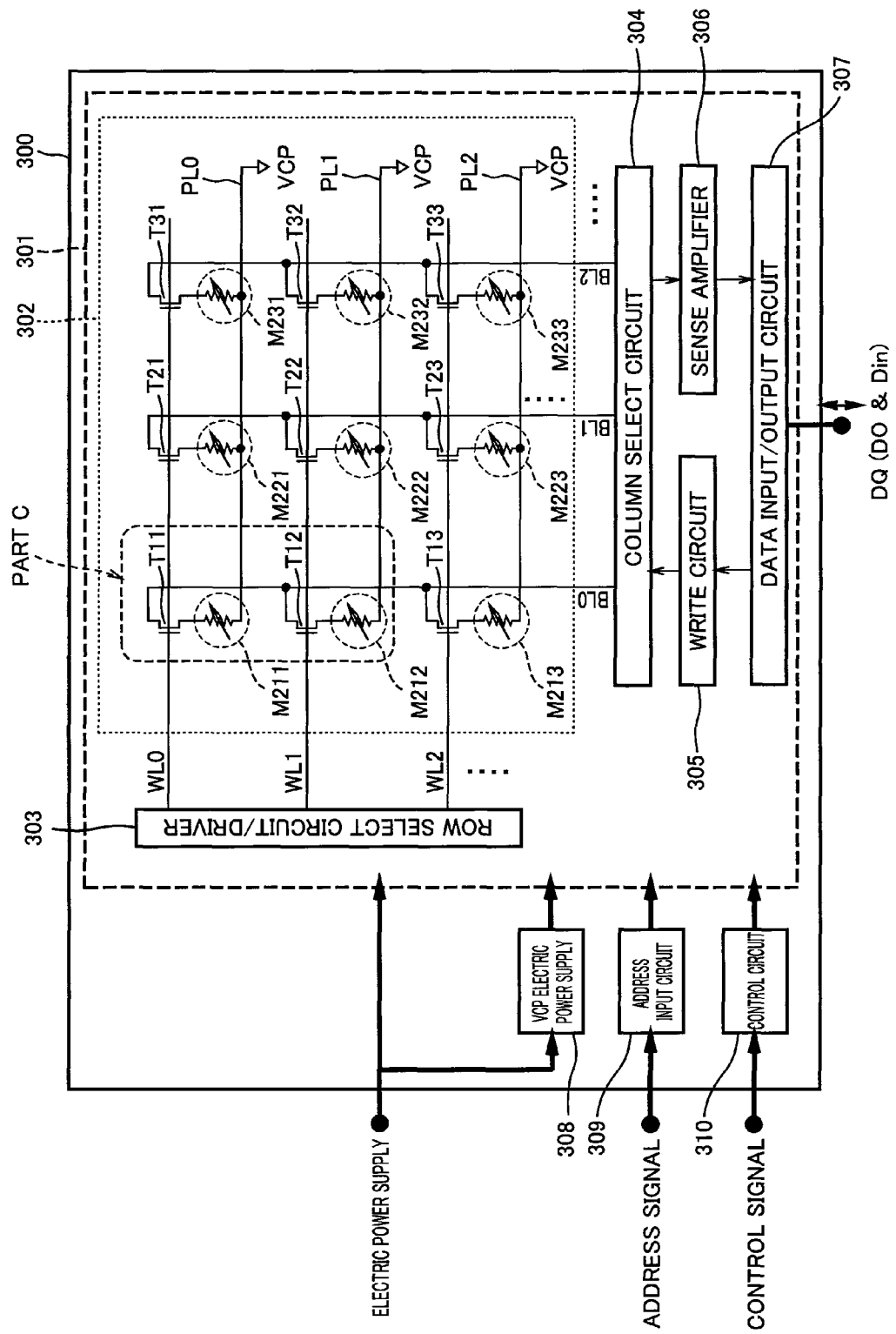
FIG. 10 is a block diagram showing a configuration of a nonvolatile semiconductor apparatus according to Embodiment 3 of the present invention.
Figure 11:
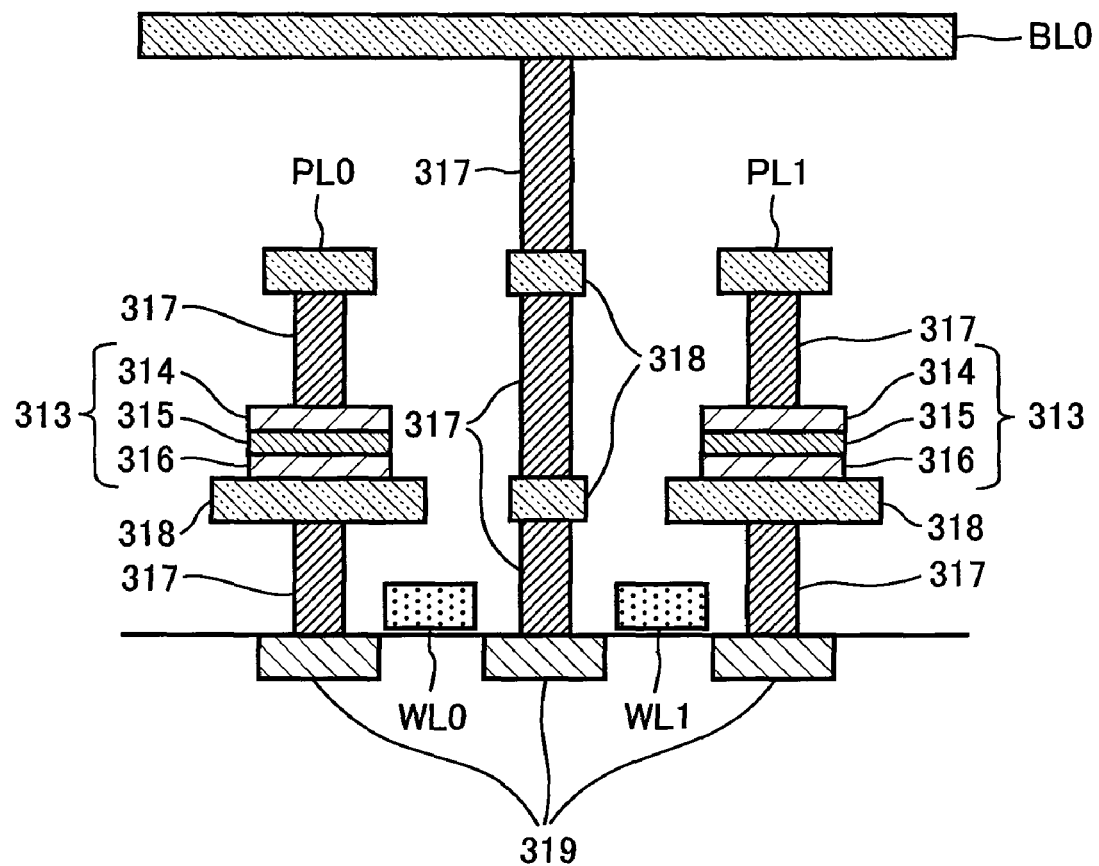
FIG. 11 is a cross-sectional view showing a configuration (configuration corresponding to 2 bits) in part C of FIG. 10.

FIG. 10 is a block diagram showing a configuration of a nonvolatile semiconductor apparatus according to Embodiment 3 of the present invention. FIG. 11 is a cross-sectional view showing a configuration (configuration corresponding to 2 bits) in part C of FIG. 10.

As shown in FIG. 10, a nonvolatile semiconductor apparatus 300 according to this embodiment includes a memory main section 301 on a semiconductor substrate. The memory main section 301 includes a memory array 302, a row select circuit/driver 303, a column select circuit 304, a write circuit 305 for writing data, a sense amplifier 306 which detects an amount of a current flowing in a selected bit line and determines the data as "1" or "0," and a data input/output circuit 307 which executes input/output processing of input/output data via the terminal DQ. The nonvolatile semiconductor apparatus 300 further includes a cell plate electric power supply (VCR electric power supply) 308, an address input circuit 309 which receives an address signal externally input, and a control circuit 310 for controlling the operation of the memory main section 301, based on the control signal externally input.

The memory array 302 includes the plural word lines WL0, WL1, WL2, . . . and the plural bit lines BL0, BL1, BL2, . . . which are formed on the semiconductor substrate and are arranged to cross each other, plural transistors T11, T12, T13, T21, T22, T23, T31, T32, T33, . . . (hereinafter expressed as "transistors T11, T12, . . . ") provided to respectively correspond to cross-points of the word lines WL0, WL1, WL2, . . . and the bit lines BL0, BL1, BL2, . . . , and plural memory cells M211, M212, M213, M221, M222, M223, M231, M232, N233 (hereinafter expressed as "memory cells M211, M212, . . . " provided to respectively correspond to the transistors T11, T12, . . . such that one memory cell corresponds to one transistor.

The memory array 302 further includes plural plate lines PL0, PL1, PL2, . . . which are arranged to extend in parallel with the word lines WL0, WL1, WL2, . . .

As shown in FIG. 11, the bit line BL0 is provided above the word lines WL0 and WL1, and the plate lines PL0 and PL1 are provided between the word lines WL0 and WL1 and the bit line BL0.

Each of the memory cells M211, M212, . . . corresponds to the nonvolatile memory element according to Embodiment 1, and includes a resistance variable layer comprising tantalum oxynitride. To be specific, the nonvolatile memory element 313 in FIG. 11 corresponds to the memory cells M211, M212, . . . in FIG. 10, and is constituted by the upper electrode 314, the resistance variable layer 315 comprising tantalum oxynitride, and the lower electrode 316.

In FIG. 11, 317 denotes a plug layer, 318 denotes a metal wire layer, and 319 denotes source/drain regions.

As shown in FIG. 10, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown), and outputs a row address signal and a column address signal to the row select circuit/driver 303 and to the column select circuit 304, respectively, based on the address signal. The address signal is a signal indicating the address of a specified memory cell to be selected from among the plural memory cells M211, M212, . . . . The row address signal is a signal indicating a row address in the address indicated by the address signal, and the column address signal is a signal indicating a column address in the address indicated by the address signal.

In a write cycle of data, the control circuit 310 outputs to the write circuit 305, a write signal for causing application of a write voltage, according to the input data Din input to the data input/output circuit 307. On the other hand, in a read cycle of data, the control circuit 310 outputs to the column select circuit 304 a read signal for causing application of a read voltage.

The row select circuit/driver 303 receives the row address signal output from the address input circuit 309, selects one from among the plural word lines WL0, WL1, WL2, . . . according to the row address signal, and applies a predetermined voltage to the selected word line.

The column select circuit 304 receives a column address signal output from the address input circuit 309, selects one from among the plurality bit lines BL0, BL1, BL2, . . . according to the column address signal, and applies the write voltage or the read voltage to the selected bit line.

Receiving the write signal output from the control circuit 310, the write circuit 305 outputs to the column select circuit 304, a signal for causing application of the write voltage to the selected bit line.

In the read cycle of data, the sense amplifier 306 detects an amount of a current flowing in the selected bit line which is a read target, and determines the data as "1" or "0." The resulting output data DO is output to the external circuit via the data input/output circuit 307.

In Embodiment 3 using the configuration of one transistor/ one nonvolatile memory portion, a storage capacity is smaller than that of the configuration using the cross-point nonvolatile memory portion in Embodiment 2. However, since Embodiment 3 may dispense with the current suppressing element such as the diode, it has an advantage that it is easily combined with the CMOS process, and operation control therefor is easy.

As in Embodiment 2, the resistance variable layer of the present invention can be formed at a low temperature. Therefore, it is advantageous that transistors and wire material such as silicide formed in a lower layer step are not affected even when a layer structure is formed in a wiring step as illustrated in this embodiment.

Furthermore, as in Embodiment 2, since the film deposition of tantalum oxynitride is easily incorporated into the existing semiconductor manufacturing process, the nonvolatile semiconductor apparatus of this embodiment can be easily manufactured.

[Example of Operation of Nonvolatile Semiconductor Apparatus]

Subsequently, an example of the operation of the nonvolatile semiconductor apparatus according to Embodiment 3 in a write cycle in which data is written and in a read cycle in which data is read, will be described with reference to a timing chart shown in FIG. 12.

Figure 12:
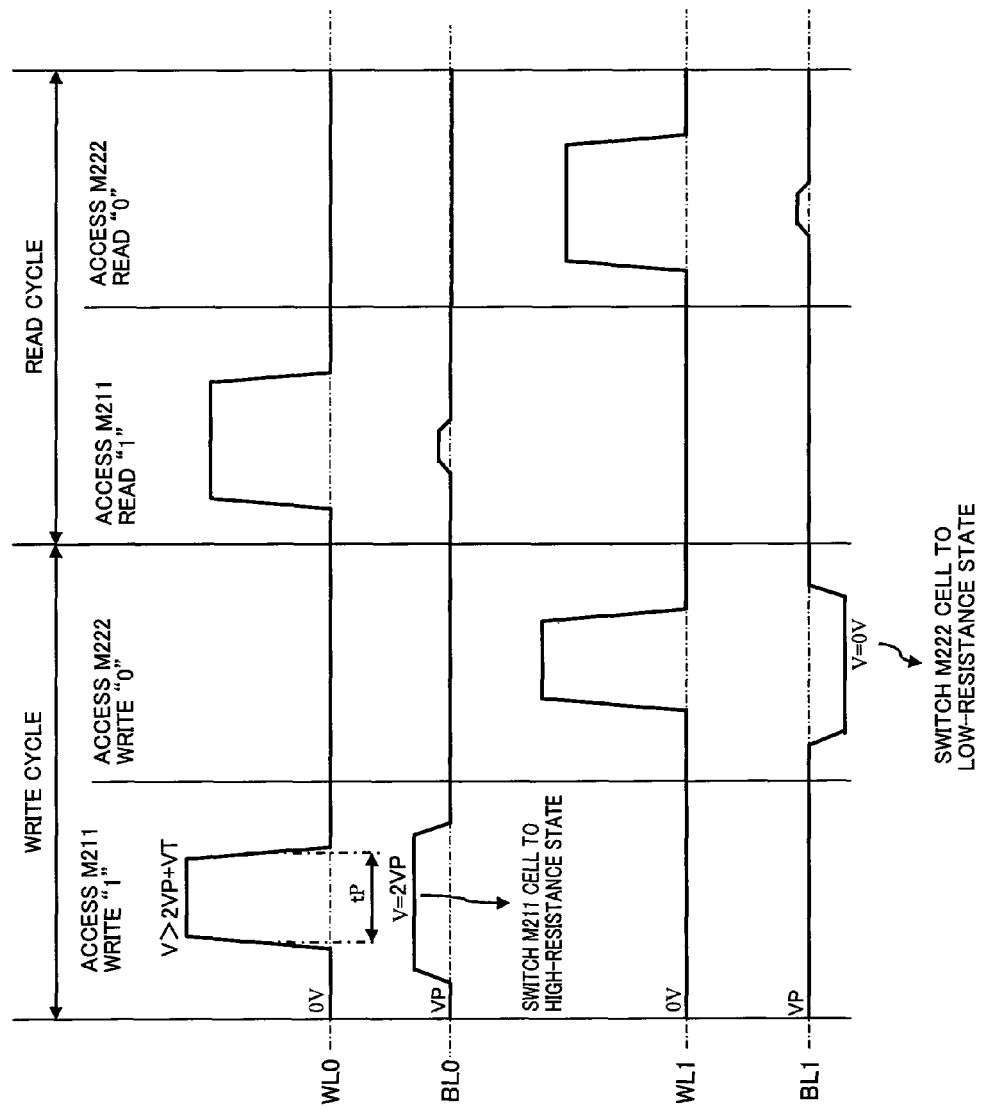
FIG. 12 is a timing chart showing an example of the operation of the nonvolatile semiconductor apparatus according to Embodiment 3 of the present invention.

FIG. 12 is a timing chart showing an example of the operation of the nonvolatile semiconductor apparatus according to Embodiment 3 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, only writing and reading of data with respect to the memory cells M211 and M222 are shown.

In FIG. 12, VP denotes a pulse voltage required to enable the resistance variable element to switch its resistance, and VT denotes a threshold voltage of the transistor. The voltage VP is always applied to the plate line, and the bit line is precharged with a voltage VP when it is unselected.

In a write cycle for the memory cell M211, a voltage which is larger than a pulse voltage 2VP+transistor threshold voltage VT and has a pulse width tP is applied to the word line WL0, causing the transistor T11 to be tuned on. According to this timing, a pulse voltage 2VP is applied to the bit line BL0. In this way, a write voltage for writing data "1" is applied to the memory cell M211, causing the resistance variable layer in the memory cell M211 to switch to the high-resistance state. That is, the data "1" is written to the memory cell M211.

Then, in a write cycle for the memory cell M222, a voltage which is larger than a pulse voltage 2VP+transistor threshold voltage VT and has a pulse width tP is applied to the word line WL1, causing the transistor T22 to be tuned on. According to this timing, a voltage of 0V is applied to the bit line BL1. In this way, a write voltage for writing data "0" is applied to the memory cell M222, causing the resistance variable layer in the memory cell M222 to switch to the low-resistance state. That is, the data "0" is written to the memory cell M222.

In a read cycle for the memory cell M211, a predetermined voltage for turning on the transistor T11 is applied to the word line WL0, and according to the timing, a pulse voltage having a smaller amplitude than the pulse width for writing is applied to the bit line BL0. Thereby, a current corresponding to the resistance value of the resistance variable layer of the memory cell M211 switched to the high-resistance state is output, and its output current value is detected, so that the data "1" is read.

In a read cycle for the memory cell M222, a voltage identical to that in the previous read cycle for the memory cell M211 is applied to the word line WL1 and to the bit line BL1. Thereby, a current corresponding to the resistance value of the resistance variable layer of the memory cell M222 switched to the low-resistance state is output, and its output current value is detected, so that the data "0" is read.

As in Embodiment 2, in this embodiment, a write operation is carried out by using a high-speed pulse.

As already described in Embodiment 2, by using the resistance variable layer comprising the tantalum oxynitride of the present invention, the nonvolatile memory element which has a low imprinting characteristic can be attained. This eliminates a need for a step such as an erase cycle or a reset cycle in the nonvolatile semiconductor apparatus according to Embodiment 3. This contributes to achievement of higher-speed writing. In addition, a write operation can be performed with a simple step.

As already described in Embodiment 2, in this embodiment, redundant relief memory cells and memory cells for parity bits for error correction may be provided separately. In that case, as these memory cells, the nonvolatile memory elements of the present invention may be used.

(Embodiment 4)

A nonvolatile semiconductor apparatus according to Embodiment 4 is a nonvolatile semiconductor apparatus which includes the nonvolatile memory element according to Embodiment 1 having a programming function and a logic circuit for executing predetermined calculation.

[Configuration of Nonvolatile Semiconductor Apparatus]

Figure 13:
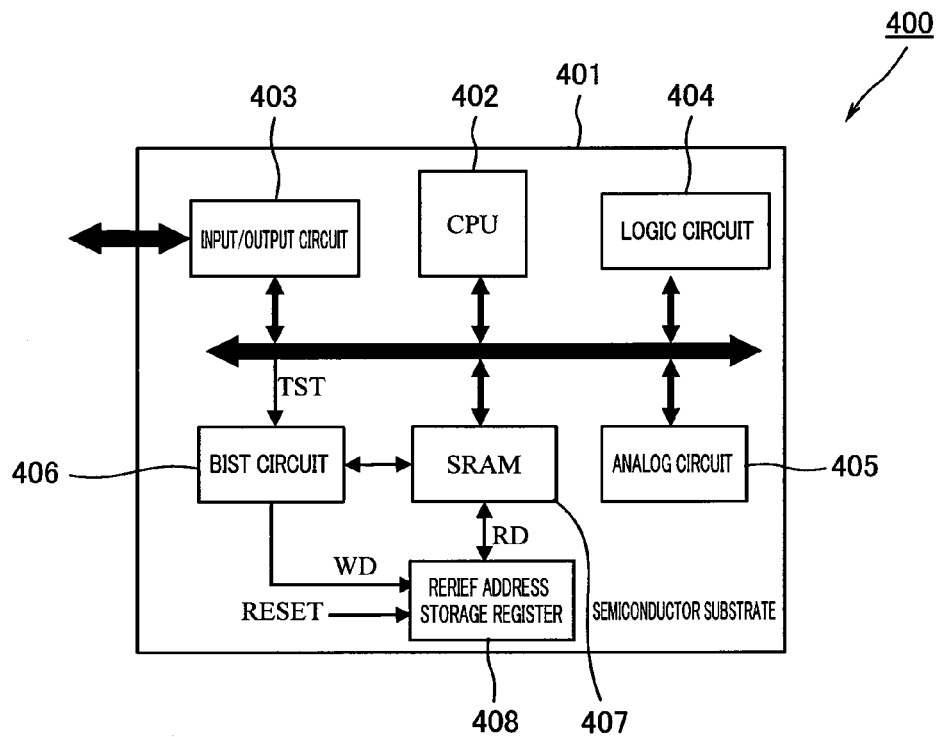
FIG. 13 is a block diagram showing a configuration of a nonvolatile semiconductor apparatus according to Embodiment 4 of the present invention.

FIG. 13 is a block diagram showing a configuration of a nonvolatile semiconductor apparatus according to Embodiment 4 of the present invention.

As shown in FIG. 13, a nonvolatile semiconductor apparatus 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and a relief address storage register 408 which is connected to the BIST circuit 406 and to the SRAM 407 and serves to store specific address data.

Figure 14:
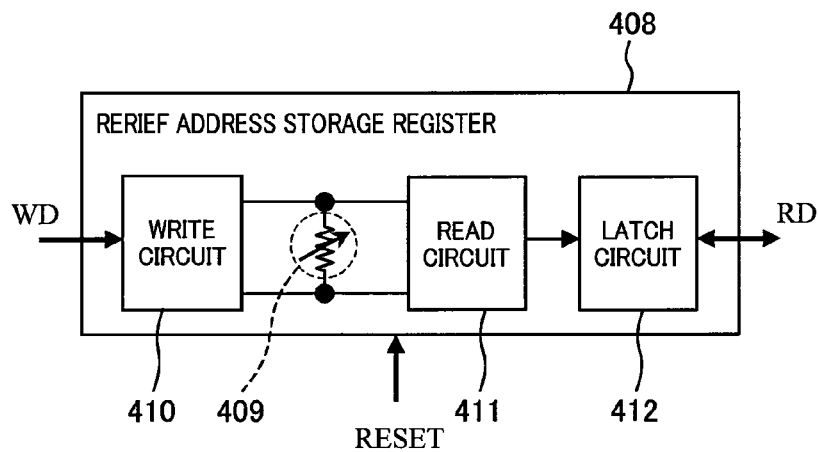
FIG. 14 is a block diagram showing a configuration of a relief address storage register included in the nonvolatile semiconductor apparatus according to Embodiment 4 of the present invention.

FIG. 14 is a block diagram showing a configuration of a relief address storage register included in the nonvolatile semiconductor apparatus according to Embodiment 4 of the present invention. FIG. 13 is a cross-sectional view showing a configuration of the relief address storage register.

Figure 15:
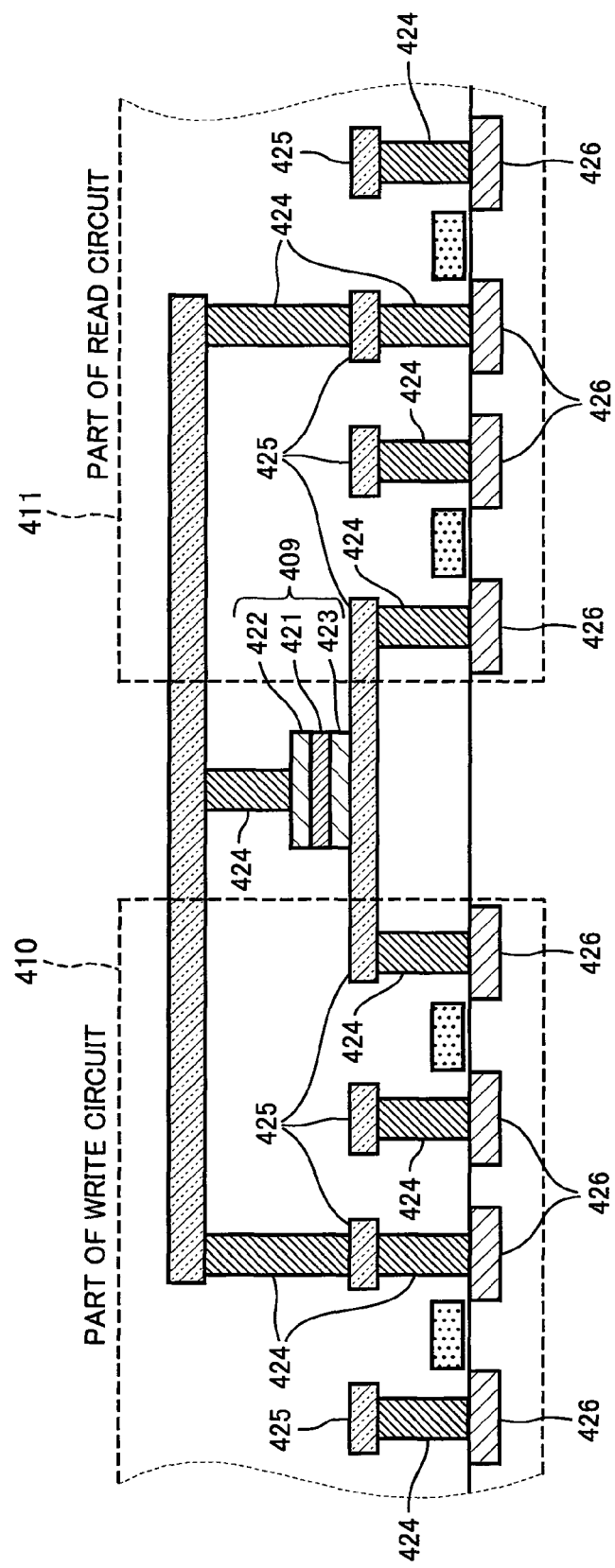
FIG. 15 is a cross-sectional view showing a configuration of the relief address storage register included in the nonvolatile semiconductor apparatus according to Embodiment 4 of the present invention.

As shown in FIGS. 14 and 15, the relief address storage register 408 includes a nonvolatile memory element 409 corresponding to the nonvolatile memory element according to Embodiment 1, a write circuit 410 for writing specific address data to the nonvolatile memory element 409, a read circuit 411 for reading the address data written in the nonvolatile memory element 409, and a latch circuit 412.

The nonvolatile memory element 409 is connected to a switch portion to the write circuit 410 side and a switch portion to the read circuit 411 side, and has a structure in which the resistance variable layer 421 is sandwiched between the upper electrode 422 and the lower electrode 423. The nonvolatile memory element 409 corresponds to the nonvolatile memory element according to Embodiment 1.

In FIG. 15, 424 denotes a plug layer, 425 denotes a metal wire layer, and 426 denotes a source/drain layer.

Whereas in this embodiment, two-layer wires are provided and the nonvolatile memory element is provided between the first wire and the second wire, multi-layer wires of three or more layers may alternately be provided and the nonvolatile memory element may be disposed between desired wires. In further alternative, the nonvolatile memory element may be disposed between plural wires as desired.

[Example of Operation of Nonvolatile Semiconductor Apparatus]

Subsequently, an example of the operation of the nonvolatile semiconductor apparatus according to this embodiment configured as described above will be described.

Hereinafter, a case where the address data is written to the relief address storage register 408 will be described. The BIST circuit 406 inspects a memory block in the SRAM 407, when receiving a diagnosis command signal TST.

The memory block is inspected during inspection in a manufacturing process of LSI, and during various diagnostic processes carried out in the case where the LSI is mounted to an actual system.

If a faulty bit is detected as a result of inspection of the memory block, the BIST circuit 406 outputs write data command signal WD to the relief address storage register 408. Receiving the write data command signal WD, the relief address storage register 408 stores therein address data corresponding to the faulty bit.

The address data is stored by switching the resistance state of the resistance variable layer in the associated register to the high-resistance state or to the low-resistance state, according to the address data. The switching of the resistance variable layer to the high-resistance state or to the low-resistance state is performed as in Embodiment 1.

In this way, the address data is written to the relief address storage register 408. Upon the SRAM 407 being accessed, the address data written in the relief address storage register 408 is read. The address data is read by detecting an output current value corresponding to the resistance state of the resistance variable layer as in Embodiment 1.

When the address data read from the relief address storage register 408 matches the address data of an access target, a backup memory cells for redundancy provided within the SRAM 407 is accessed, so that data is read or written.

The self diagnosis performed as described above eliminates a need for an expensive LSI tester provided externally, in inspection in the manufacturing process. In addition, the self diagnosis has an advantage that at Speed test can be conducted. Furthermore, the self diagnosis has an advantage that since faulty bits due to deterioration with time can be relieved as well as faulty bits in the inspection, a high quality can be maintained for a long period of time.

The nonvolatile semiconductor apparatus according to this embodiment is applicable to a case where data is written only once in the manufacturing process and to a case where data is rewritten repeatedly after shipment of products.

[Method of Manufacturing Nonvolatile Semiconductor Apparatus]

Subsequently, a manufacturing method of the nonvolatile semiconductor apparatus according to this embodiment as described above will be described.

Figure 16:
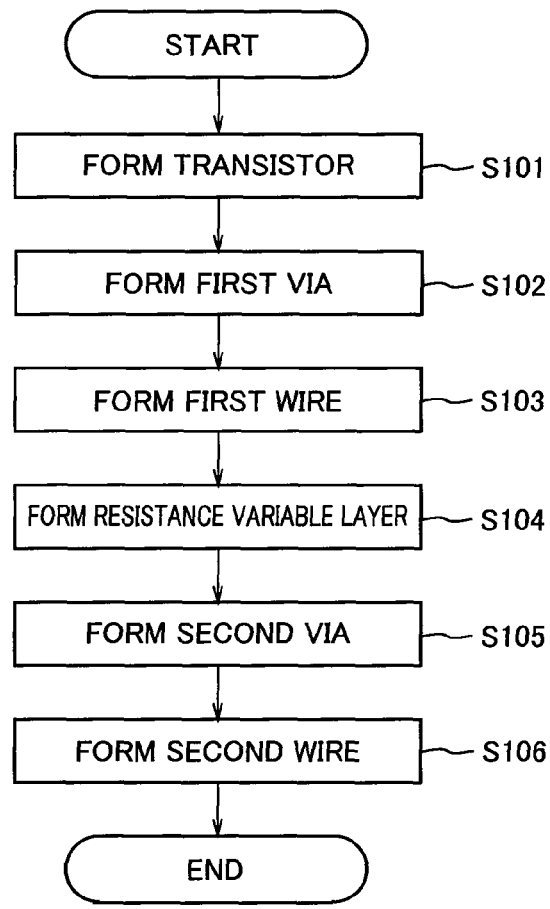
FIG. 16 is a flowchart showing a main flow of a manufacturing process of the nonvolatile semiconductor apparatus according to Embodiment 4 of the present invention.
Figure 17:
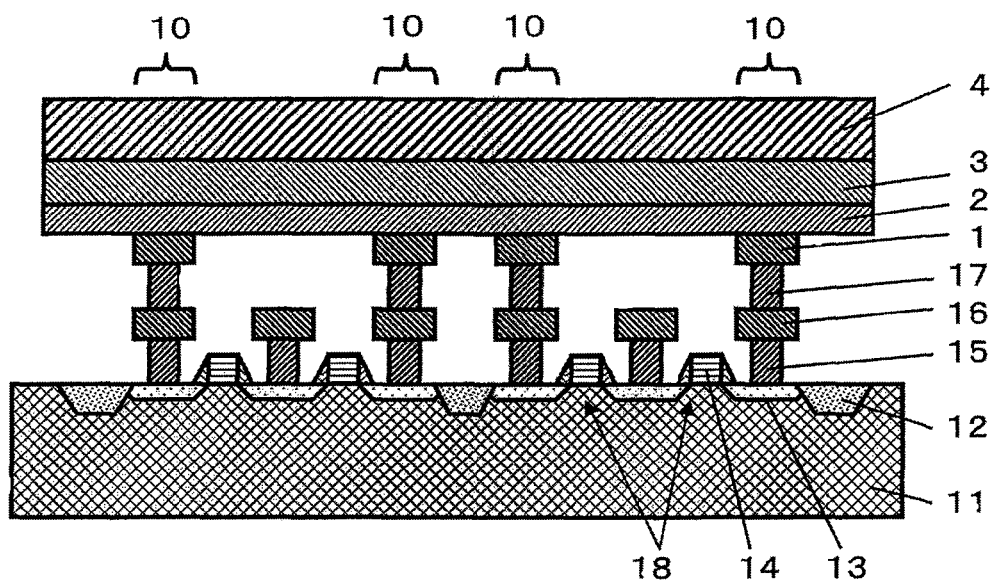
FIG. 17 is a cross-sectional view showing a configuration of a conventional memory element.

FIG. 16 is a flowchart showing a main flow of a manufacturing process of the nonvolatile semiconductor apparatus according to Embodiment 4 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed as described in Embodiment 1.

Then, a second via is formed on the resistance variable layer (S105), and further, a second wire is formed thereon (S106).

As described above, the manufacturing method of the nonvolatile semiconductor apparatus of this embodiment is such that the step of forming the electrodes and the resistance variable layer is added to the manufacturing process of the COMS process. Therefore, the nonvolatile semiconductor apparatus can be easily manufactured by utilizing the existing CMOS process. In addition, since additional steps are fewer and the layer thickness of the resistance variable layer is relatively small, the time of the process can be shortened.

As in Embodiment 2, the resistance variable layer of the present invention can be formed at a low temperature. Therefore, it is advantageous that transistors and wire material such as silicide formed in a lower layer step are not affected even when a layer structure is formed in a wiring step illustrated in this embodiment.

Since the electrode portion can be formed with 1 μm square or smaller and other circuits can be formed in the CMOS process, a small-sized nonvolatile switch circuit can be easily attained.

Instead of using the nonvolatile memory element including the resistance variable layer comprising tantalum oxynitride in Embodiment 1, the nonvolatile semiconductor apparatus may be attained by using a known flash memory nonvolatile memory element or a known FeRAM memory nonvolatile memory element. In these cases, however, a special process step and material become necessary, which makes it difficult that these nonvolatile memory elements are compatible with the CMOS process. For this reason, a cost problem arises, and the manufacturing steps significantly increases, which is not practical. Further, a problem arises, that these nonvolatile memory elements are difficult to use as the programming element, because writing and reading of data are complicated in these memory elements.

As a configuration which is compatible with the CMOS process, there is provided a memory cell called a CMOS nonvolatile memory cell, which operates equivalently to the flash memory cell by floating the gate wires in the CMOS process. However, such a configuration causes problems that area of the element portion increases and control of its operation is complicated.

The configuration using an electric fuse element such as a silicide fuse element may be compatible with the CMOS process. In this case, problems that rewriting of the data cannot be performed, and the area of the electrode portion increases arise.

The wires may be trimmed by a known laser. In this case, miniaturization is determined by a mechanical precision of a laser trimmer, which is limited only in a manufacturing process, and therefore cannot be realized. Or, there is a limitation on layout, because the wires must be positioned as an uppermost layer.

Whereas the nonvolatile memory element in Embodiment 1 is used as the relief address storage register of the SRAM, the following examples may be alternatively used. For example, the nonvolatile memory element in Embodiment 1 may be used as the relief address storage register for faulty bits in DRAM, ROM, or the nonvolatile semiconductor apparatuses according to Embodiment 2 and Embodiment 3.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM which is a product, a nonvolatile switch element for reconfigurable logic and EPGA, and a nonvolatile register.

(Other Embodiment)

The nonvolatile semiconductor apparatus according to Embodiment 4 may be configured to include the nonvolatile semiconductor apparatus according to Embodiment 2, that is, to integrate on one semiconductor substrate the cross-point type nonvolatile semiconductor apparatus according to Embodiment 2 and the LSI having the CPU or the like according to Embodiment 4.

In this case, the cross-point type nonvolatile semiconductor apparatus according to Embodiment 2 and the LSI having the CPU or the like according to Embodiment 4 may be formed on different semiconductor substrates, and thereafter may be molded into one package.

The nonvolatile semiconductor apparatus according to Embodiment 4 may be configured to include the nonvolatile semiconductor apparatus according to Embodiment 3, that is, to integrate on one semiconductor substrate the nonvolatile semiconductor apparatus having the one transistor/one nonvolatile memory portion configuration according to Embodiment 3 and the LSI having the CPU or the like according to Embodiment 4.

In this case, also, the nonvolatile semiconductor apparatus having the one transistor/one nonvolatile memory portion configuration according to Embodiment 3 and the LSI having the CPU or the like according to Embodiment 4 may be formed on different semiconductor substrates, and thereafter may be molded into one package.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

Industrial Applicability

A nonvolatile memory element and a nonvolatile semiconductor apparatus of the present invention are capable of high-speed operation and has a stable rewrite characteristic. They are useful as nonvolatile memory elements and the like which are used in various electronic devices such as digital home electric appliances, memory cards, cellular phones, and personal computers.

The invention claimed is:

1. A nonvolatile memory element comprising:
   a first electrode;
   a second electrode; and
   a resistance variable layer disposed between the first electrode and the second electrode,
   wherein the resistance variable layer comprises an oxide containing tantalum and nitrogen and is a semiconductor or an electric conductor, and
   the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops.

2. The nonvolatile memory element according to claim 1, wherein
   the nonvolatile memory element has an initial resistance value which is not smaller than 133 ohm and not larger than $3.1 \times 10^7$ ohm.

3. The nonvolatile memory element according to claim 1, wherein
   a content ratio of oxygen to nitrogen in the resistance variable layer is not smaller than 1.08 and not larger than 1.35.

4. A method of manufacturing a nonvolatile memory element including
   a first electrode;
   a second electrode; and
   a resistance variable layer disposed between the first electrode and the second electrode, wherein the resistance variable layer includes an oxide containing tantalum and nitrogen and is a semiconductor or an electric conductor, the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops, and the oxide is formed by a sputtering process.

5. A nonvolatile semiconductor apparatus comprising:
a semiconductor substrate; and
a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires, and nonvolatile memory elements which are provided to respectively correspond to three-dimensional cross points between the plural first electrode wires and the plural second electrode wires, wherein each of the nonvolatile memory elements includes a resistance variable layer disposed between the first electrode wire and the second electrode wire;

wherein the resistance variable layer includes an oxide containing tantalum and nitrogen and is a semiconductor or an electric conductor, and the resistance variable layer switches from a high-resistance state to a low-resistance state in which a resistance value is lower than a resistance value corresponding to the high-resistance state, in response to a first electric signal with a first polarity which is applied between the first electrode wire and the second electrode wire retains the low-resistance state after application of the first electric signal stops, switches from the low-resistance state to the high-resistance state in response to a second electric signal with a second polarity different from the first polarity which is applied between the first electrode wire and the second electrode wire, and retains the high-resistance state after application of the second electric signal stops.

6. A nonvolatile semiconductor apparatus comprising:
a semiconductor substrate; and
a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires, and nonvolatile memory elements which are provided to respectively correspond to three-dimensional cross points between the plural first electrode wires and the plural second electrode wires, wherein each of the nonvolatile memory elements includes a first electrode connected to the first electrode wire; a second electrode connected to the second electrode wire; and a resistance variable layer disposed between the first electrode and the second electrode, the resistance variable layer comprises an oxide containing tantalum and nitrogen and is a semiconductor or an electric conductor, and the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops.

7. The nonvolatile semiconductor apparatus according to claim 5,
wherein each of the nonvolatile memory elements includes a current suppressing element between the first electrode and the second electrode;
and wherein the current suppressing element is electrically connected to the resistance variable layer.

8. The nonvolatile semiconductor apparatus according to claim 5, comprising a multi-layer memory array in which plural layers of the memory array are stacked.

9. A nonvolatile semiconductor apparatus comprising:
a semiconductor substrate;
plural word lines and plural bit lines which are provided on the semiconductor substrate such that the plural word lines and the plural bit lines cross each other;
plural transistors provided to respectively correspond to cross points between the plural word lines and the plural bit lines; and
plural nonvolatile memory elements provided to respectively correspond to the plural transistors such that one nonvolatile memory element corresponds to one transistor, wherein each of the nonvolatile memory elements includes a first electrode, a second electrode, and a resistance variable layer disposed between the first electrode and the second electrode, the resistance variable layer comprises an oxide containing tantalum and nitrogen and is a semiconductor or an electric conductor, and the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops.

10. A nonvolatile semiconductor apparatus comprising:
a semiconductor substrate;
a logic circuit provided on the semiconductor substrate, for executing predetermined calculation; and
a nonvolatile memory element provided on the semiconductor substrate and having a programming function, wherein the nonvolatile memory element includes a first electrode, a second electrode, and a resistance variable layer disposed between the first electrode and the second electrode, the resistance variable layer comprises an oxide containing tantalum and nitrogen and is a semiconductor or an electric conductor, and the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops.

11. A semiconductor apparatus comprising:
a semiconductor substrate;
a logic circuit provided on the semiconductor substrate, for executing predetermined calculation; and
a nonvolatile memory element provided on the semiconductor substrate and having a programming function, wherein:
the nonvolatile memory element includes a first electrode, a second electrode, and a resistance variable layer disposed between the first electrode and the second electrode,
the resistance variable layer comprises an oxide containing tantalum and nitrogen and is a semiconductor or an electric conductor,
the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops, and
the semiconductor apparatus further comprises the nonvolatile semiconductor apparatus according to claim 5.

12. The nonvolatile semiconductor apparatus according to claim 6,
wherein each of the nonvolatile memory elements includes a current suppressing element between the first electrode and the second electrode;
and wherein the current suppressing element is electrically connected to the resistance variable layer.

13. The nonvolatile semiconductor apparatus according to claim 6,
comprising a multi-layer memory array in which plural layers of the memory array are stacked.

14. A semiconductor apparatus comprising:
a semiconductor substrate;
a logic circuit provided on the semiconductor substrate, for executing predetermined calculation; and
a nonvolatile memory element provided on the semiconductor substrate and having a programming function, wherein:
the nonvolatile memory element includes a first electrode, a second electrode, and a resistance variable layer disposed between the first electrode and the second electrode,
the resistance variable layer comprises an oxide containing tantalum and nitrogen and is a semiconductor or an electric conductor,
the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops, and
the semiconductor apparatus further comprises the nonvolatile semiconductor apparatus according to claim 6.

15. A semiconductor apparatus comprising:
a semiconductor substrate;
a logic circuit provided on the semiconductor substrate, for executing predetermined calculation; and
a nonvolatile memory element provided on the semiconductor substrate and having a programming function, wherein:
the nonvolatile memory element includes a first electrode, a second electrode, and a resistance variable layer disposed between the first electrode and the second electrode,
the resistance variable layer comprises an oxide containing tantalum and nitrogen and is a semiconductor or an electric conductor,
the resistance variable layer switches from a high-resistance state to a low-resistance state in which a resistance value is lower than a resistance value corresponding to the high-resistance state, in response to a first electric signal with a first polarity which is applied between the first electrode and the second electrode, retains the low-resistance state after application of the first electric signal stops, switches from the low-resistance state to the high-resistance state in response to a second electric signal with a second polarity different from the first polarity which is applied between the first electrode and the second electrode, and retains the high-resistance state after application of the second electric signal stops, and
the semiconductor apparatus further comprises the nonvolatile semiconductor apparatus according to claim 9.

* * * * *